United States Patent [19]
Chang et al.

[11] 3,967,263
[45] June 29, 1976

[54] TEXT EDITING SYSTEM

[75] Inventors: Hsu Chang, Yorktown Heights; Share-Young Lee, Lake Mohegan, both of N.Y.

[73] Assignee: International Business Machines Corporation, Armonk, N.Y.

[22] Filed: May 14, 1974

[21] Appl. No.: 469,927

[52] U.S. Cl. .................. 340/172.5; 235/92 SH; 340/174 FB; 340/174 KC; 340/174 SR
[51] Int. Cl.² ............. G06F 15/40; G11C 19/08
[58] Field of Search ............ 235/92 SH; 340/172.5, 340/174 FB, 174 KC, 174 SR, 174 TF

[56] References Cited
UNITED STATES PATENTS

| | | | |
|---|---|---|---|
| 3,670,313 | 6/1972 | Beausoleil et al. | 340/174 TF |
| 3,688,275 | 8/1972 | Fredrickson et al. | 340/172.5 |
| 3,689,902 | 9/1972 | Chang et al. | 340/174 TF |
| 3,701,125 | 10/1972 | Chang et al. | 340/174 TF |
| 3,701,132 | 10/1972 | Bonyhard et al. | 340/174 TF |
| 3,706,075 | 12/1972 | Fredrickson et al. | 340/172.5 |
| 3,737,881 | 6/1973 | Cordi et al. | 340/174 TF |
| 3,760,387 | 9/1973 | Chang et al. | 340/174 TF |
| 3,766,534 | 10/1973 | Beausoleil et al. | 340/172.5 |
| 3,772,658 | 11/1973 | Sarlo | 340/174 SR X |
| 3,838,407 | 9/1974 | Juliussen | 340/174 TF |

*Primary Examiner*—R. Stephen Dildine, Jr.
*Attorney, Agent, or Firm*—Jackson E. Stanland

[57] ABSTRACT

A text editing system which is completely comprised of magnetic bubble domain components (or charge-coupled devices) is described. The essential parts of the system are a passive storage comprising a plurality of shift registers which are a convertible structure, i.e., they can be randomly accessed or sequentially accessed depending upon the state of a plurality of conversion switches. This provides great flexibility in entry, retrieval, and restoring. An active storage comprising a plurality of shift registers is used for various text editing functions, such as insertion of data, deletion of data, etc. In the active storage, an editing shift register is provided which implements the various text editing functions using techniques such as freezing data bits and bypassing data bits in order to change the order of the data and to close gaps which may occur in the data. A write decoder is provided for selective entry of text into the passive storage and a read decoder is provided for selecting the contents of a specific shift register in the passive storage for data manipulation. The conversion switches are also used to control data flow paths or directions and to maintain the proper order of the data. Control circuits are provided to coordinate and control the functions of the various storages, the decoders, and the switches. The principles used for the overall system can be implemented with bubble domain devices or with charge coupled devices.

26 Claims, 34 Drawing Figures

SYSTEM ORGANIZATION

IDLE CONNECTION

SERIAL CONNECTION
(UPWARD)

SERIAL CONNECTION
(DOWNWARD)

IDLE

SEQUENTIAL ACCESS

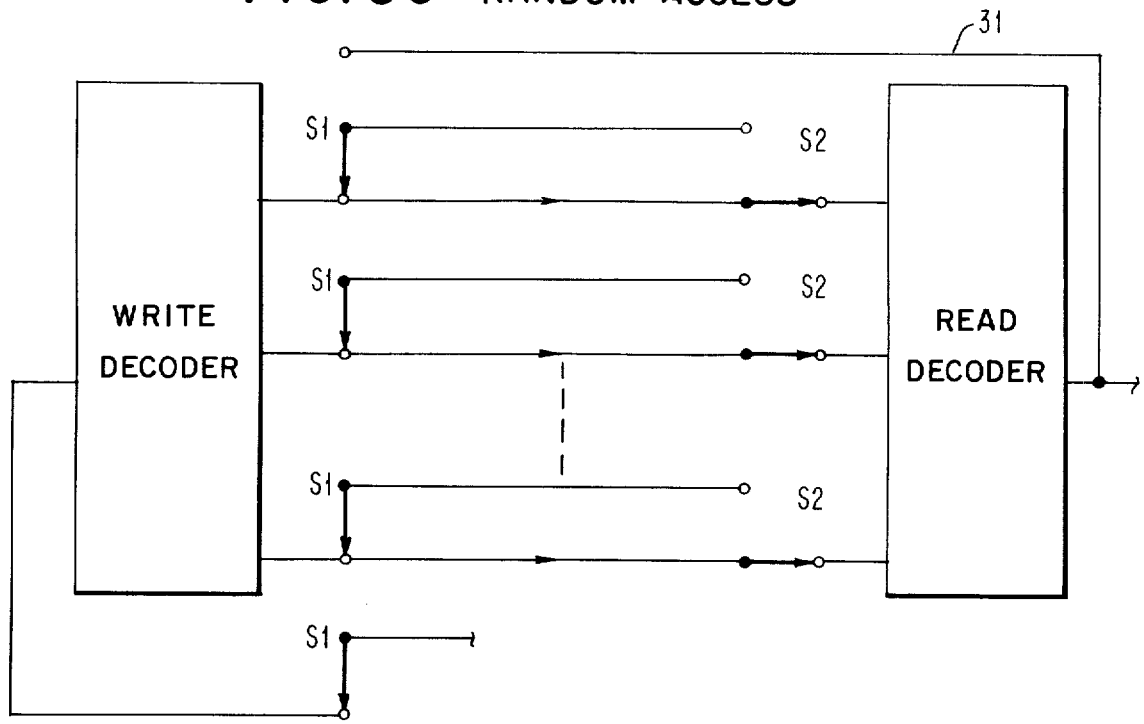
FIG. 3C RANDOM ACCESS
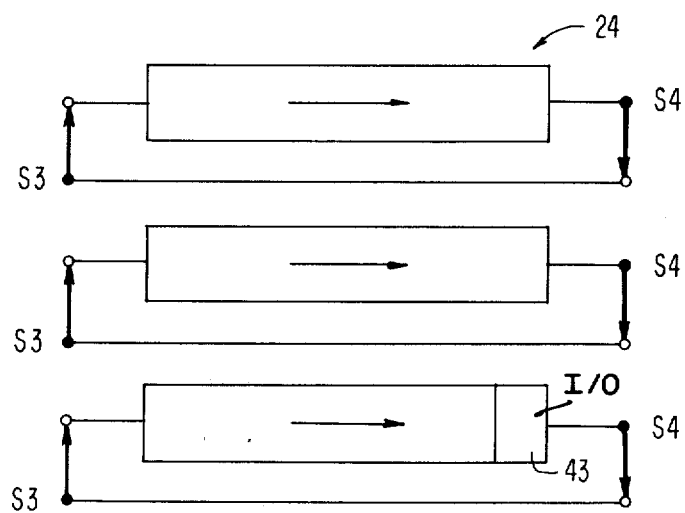
FIG. 4A IDLE

FORWARD

BACKWARD

ACTUAL OVERLAY CONFIGURATION

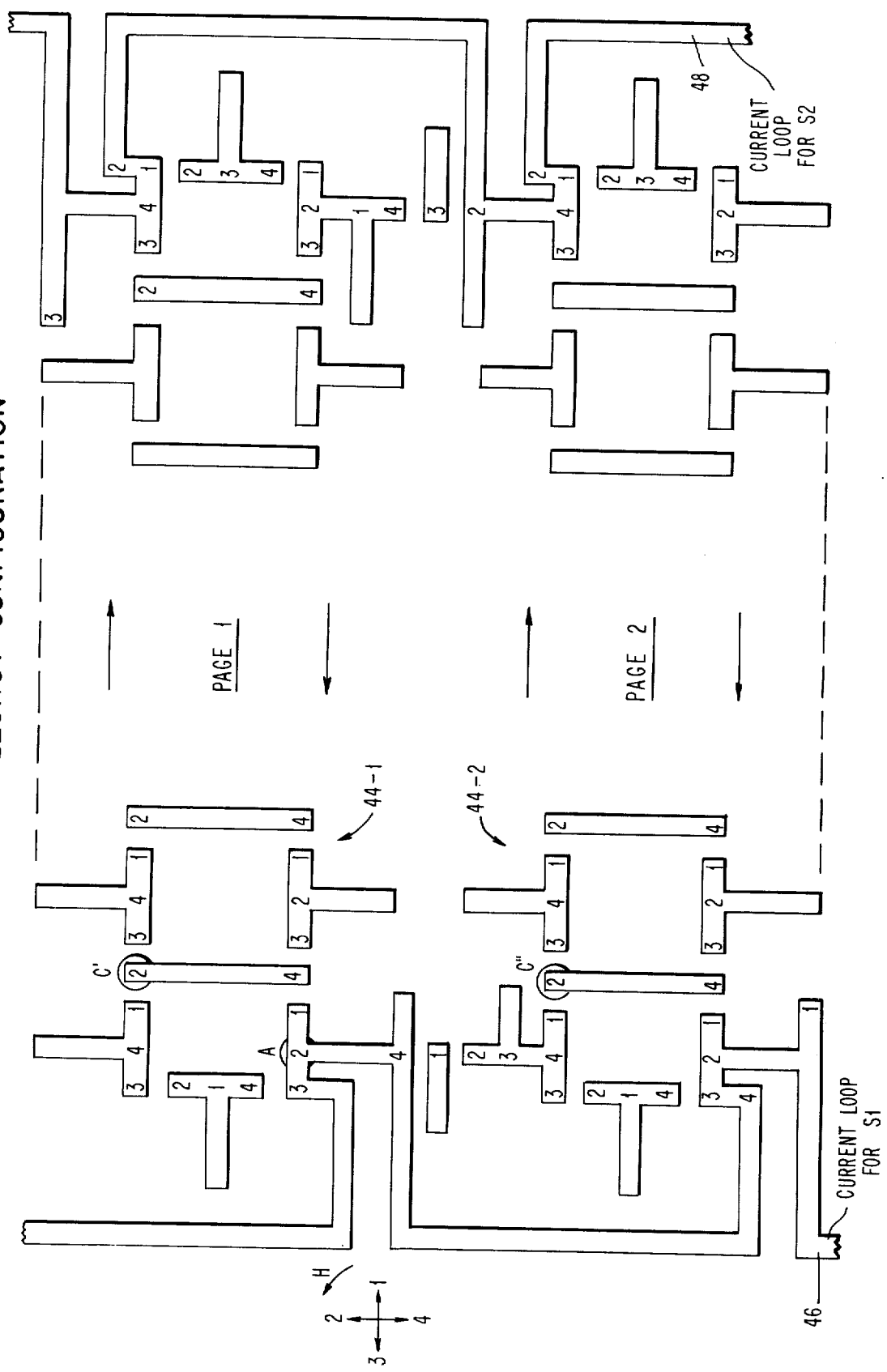
FIG. 5B SINGLE LEVEL METALLURGY CONFIGURATION

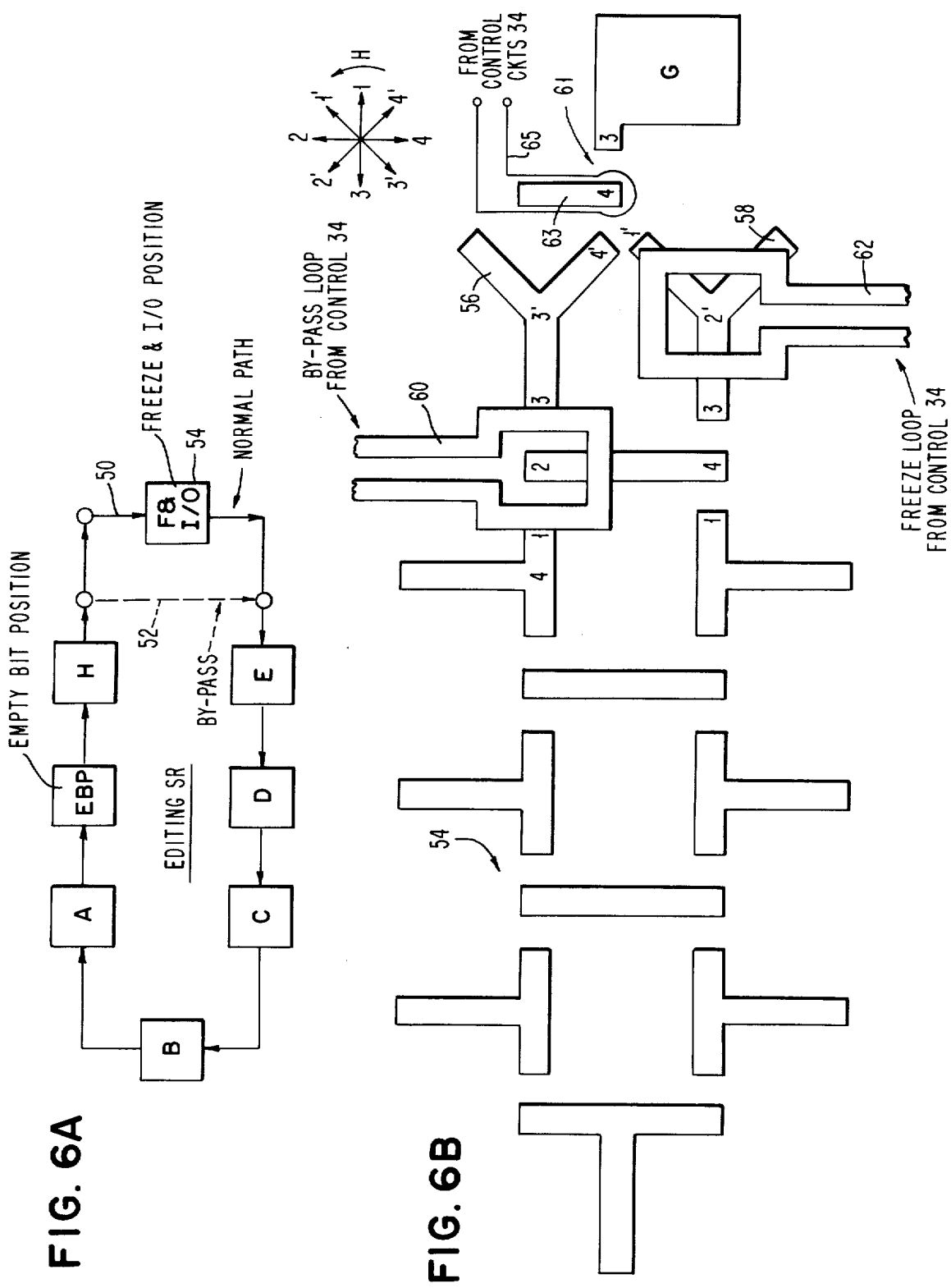

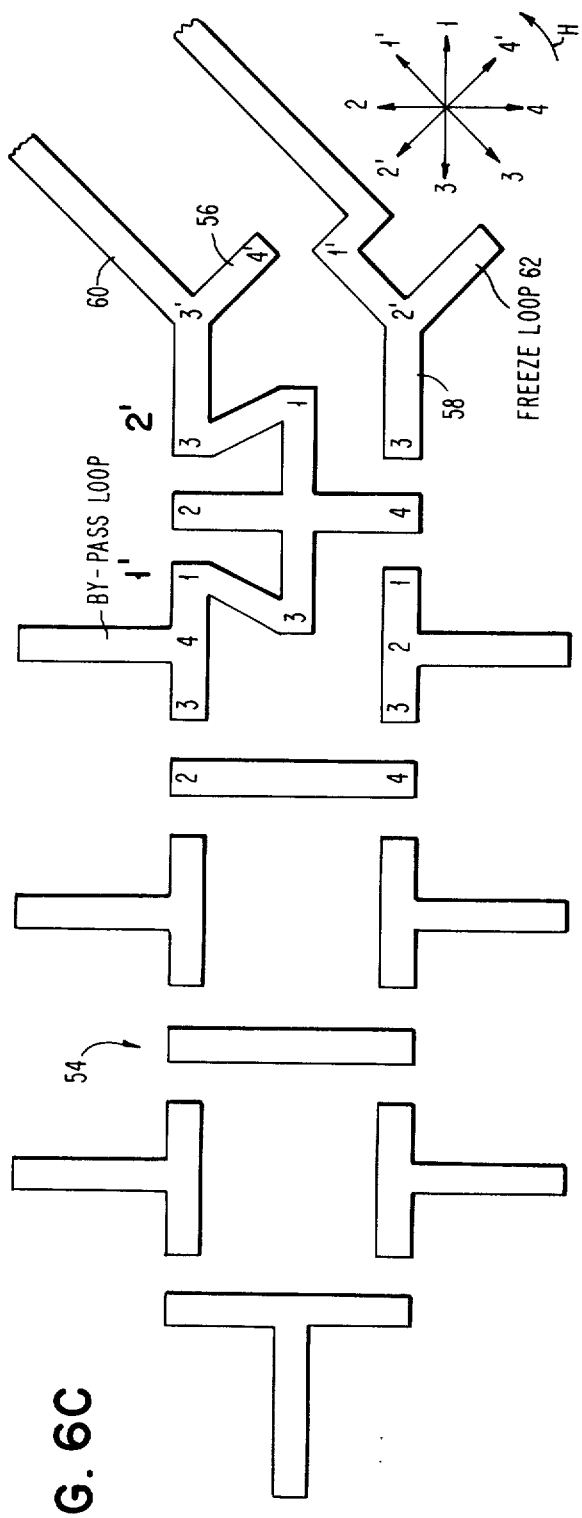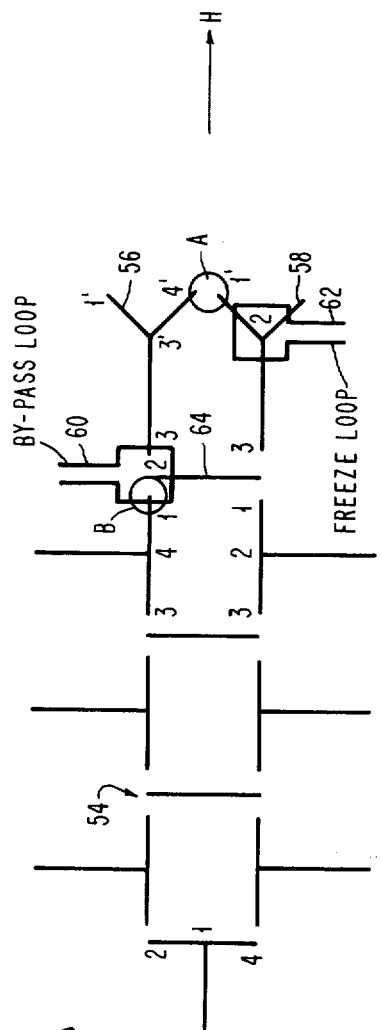
FIG. 6C
FIG. 7A

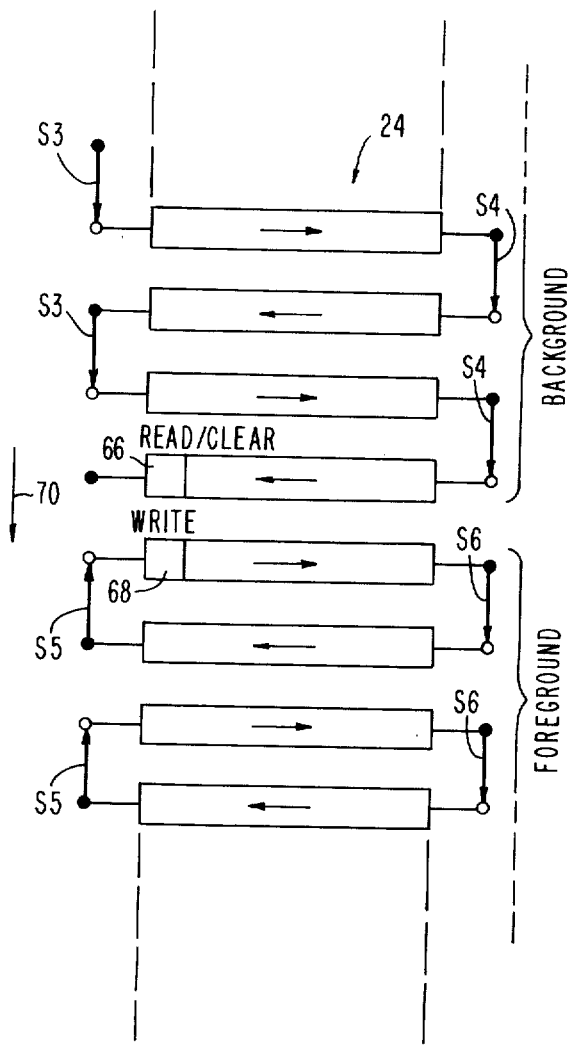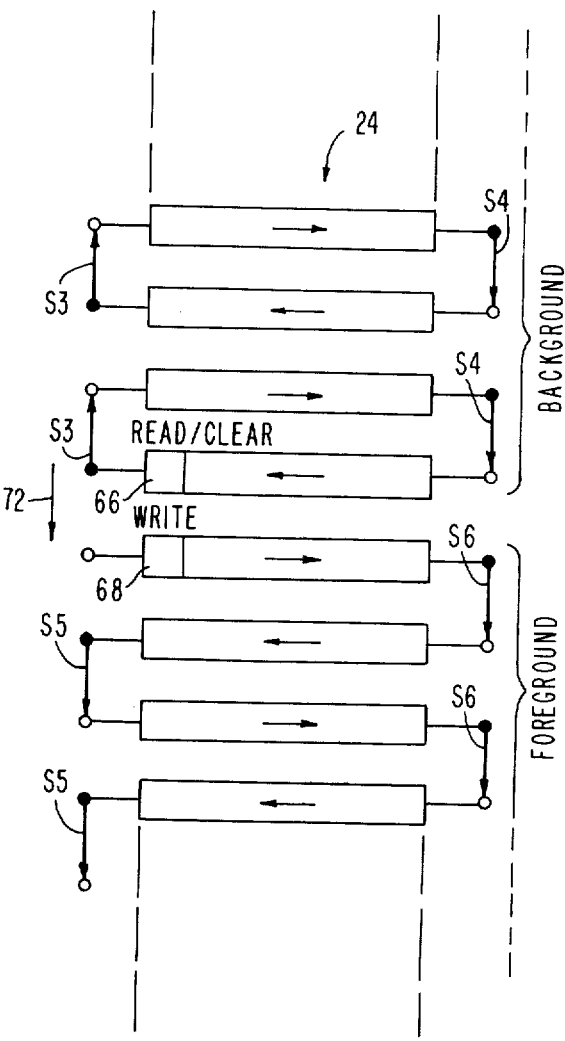
FIG. 8A
LINE DELETION
FIG. 8B
LINE INSERTION

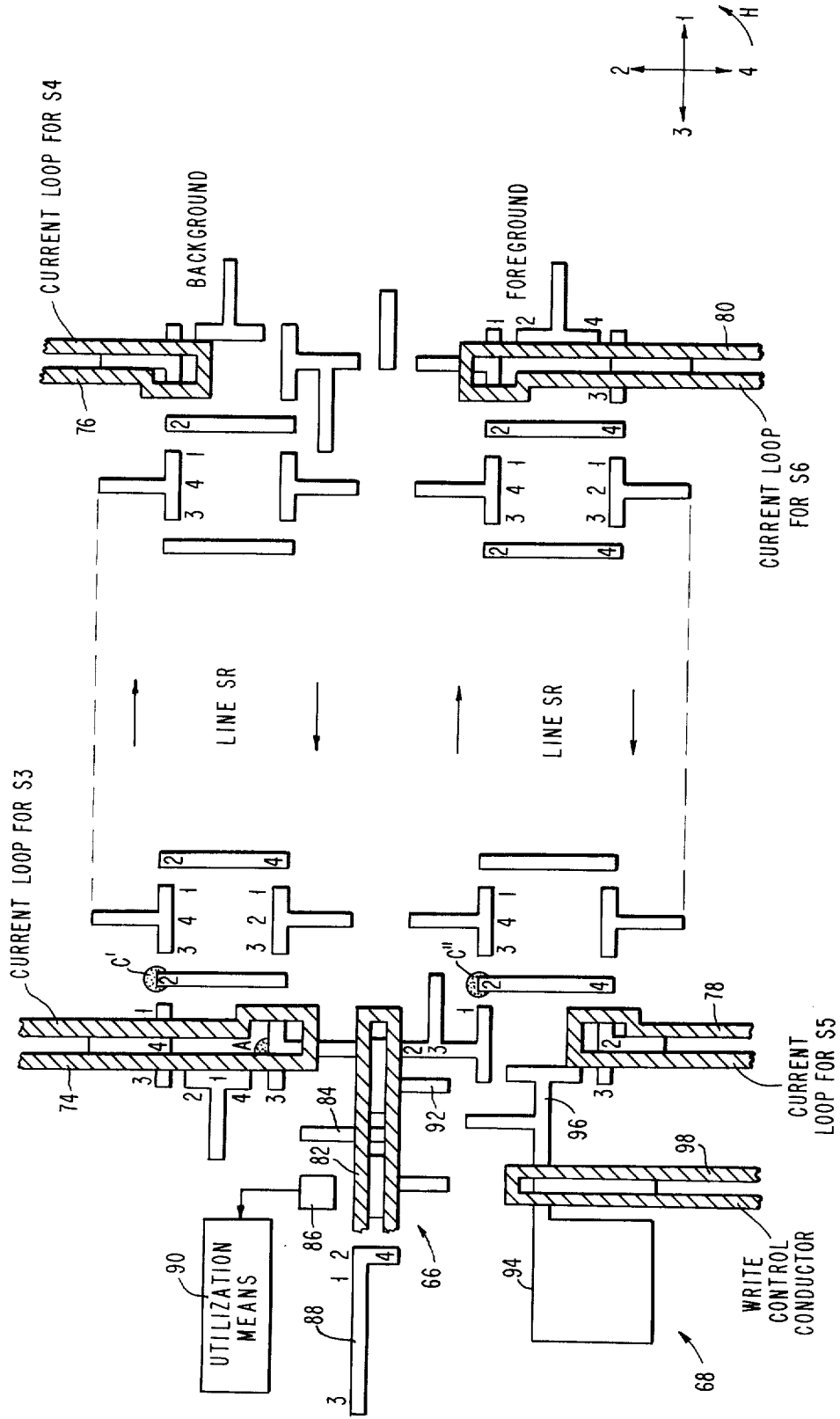

INITIAL STATUS

ADVANCE POINTER BY ONE BIT POSITION

BACKSPACE POINTER BY ONE BIT POSITION

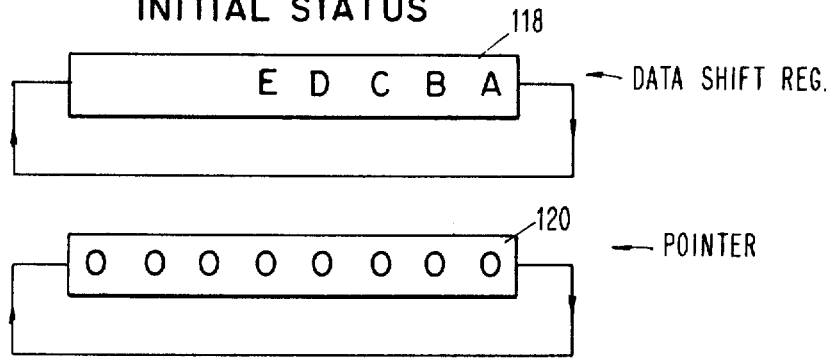
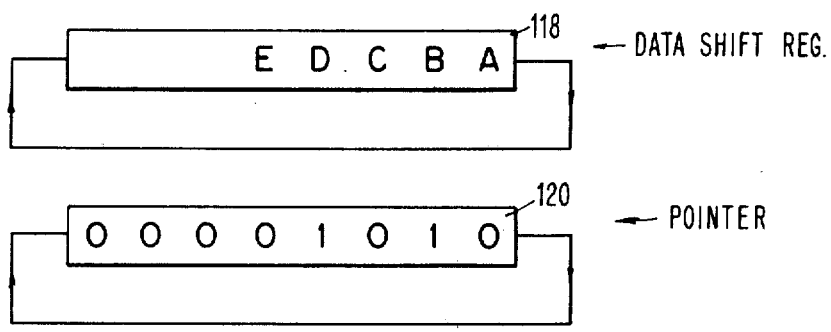
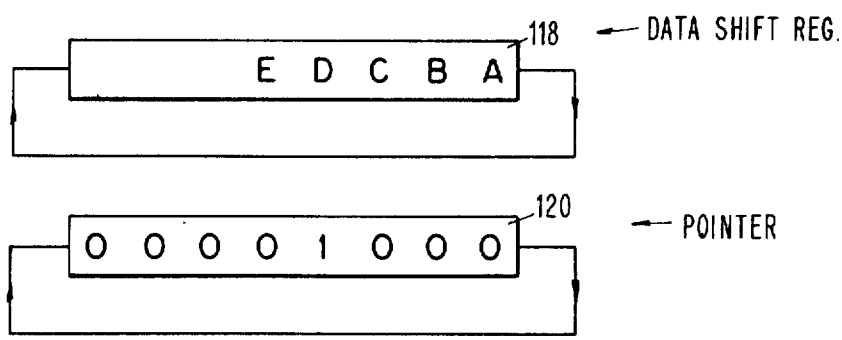

|  | INPUTS | | | |
| --- | --- | --- | --- | --- |
| OUTPUTS | $9=2^3+2^0$ | $8=2^3$ | $7=2^2+2^1+2^0$ | $6=2^2+2^1$ |
|  | 9 | 8 | 7 | 6 |
| $a_8$ | 1 | 1 | 0 | 0 |
| $a_4$ | 0 | 0 | 1 | 1 |
| $a_2$ | 0 | 0 | 1 | 1 |
| $a_1$ | 1 | 0 | 1 | 0 |

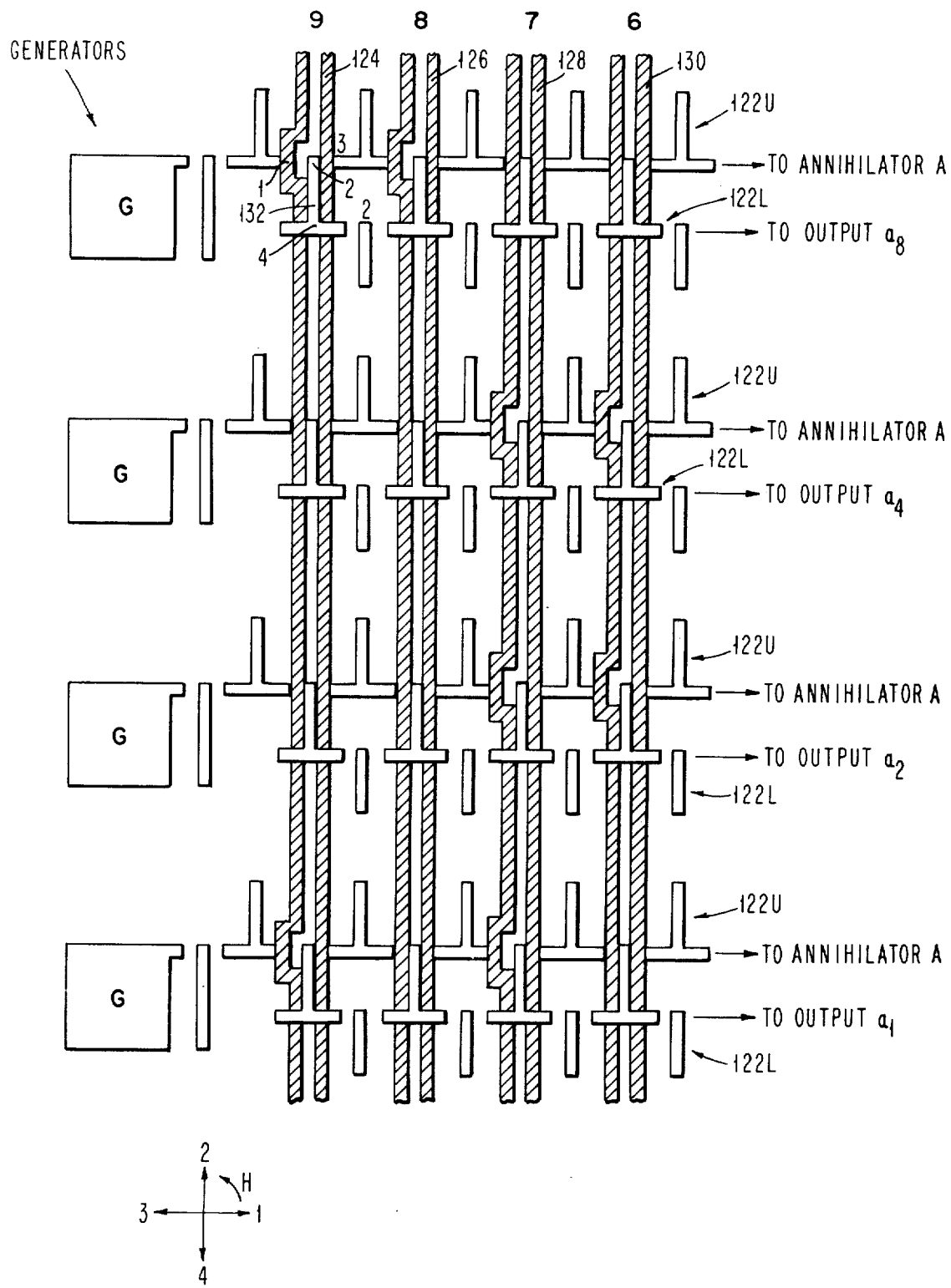

TEXT EDITING SYSTEM

CROSS REFERENCE TO RELATED APPLICATIONS

Copending application Ser. No. 469,926 filed the same day as the present application, describes a text editing system using an editing shift register of the type shown in the present application.

BACKGROUND OF THE INVENTION

1. Field of the Invention

This invention relates to text editing systems which can be implemented by magnetic bubble domains or by charge coupled devices, and more particularly to a dynamic shift register text editing system characterized by a convertible structure which allows sequential access or random access, either circulation of data, forward or backward movement of data, etc. Such great flexibility of data maneuverability is achieved without reversing the field rotation.

2. Description of the Prior Art

Current keyboard text editing facilities use mechanically accessed magnetic media for storage and semiconductor shift registers as editing devices. Problems of speed discrepancy and synchronization dictate the use of a semiconductor random-access memory as a buffer. This complex system requires considerable semiconductor logic devices for control. As will be appreciated, this type of approach requires several different technologies and necessitates suitable interfaces for these different technologies.

Magnetic bubble domain technology provides inexpensive, non-volatile, non-mechanical storage devices suitable for large capacity memories. Indeed, considerable attention has been paid to the memory applications of magnetic bubble domains, as is amply reflected in the published literature. However, bubble domains do offer logic and switch capabilities as can be seen by referring to U.S. Pat. No. 3,701,125, which describes an on-chip memory-decoder system.

Some prior art in magnetic bubble technology describes reordering of data bits represented by bubble domain patterns. For instance, reference is made to the dynamically ordered magnetic bubble domain memories described in U.S. Pat. No. 3,670,313 and U.S. Pat. No. 3,797,002. Additionally, reference is made to U.S. Pat. No. 3,701,132. All of these prior art patents describe the relocation of bubble domain data bits in systems where the bubble domains are propagated by the use of a reorienting, in-plane magnetic field. However, the technique for reordering data in these prior art patents is based on magnetic field reversal or stoppage. This is attended by increasing difficulty in the design of circuits for the movement of bubble domains in an entire chip, where the reversal or stoppage of the magnetic field has an effect on all domains in the magnetic chip. This means that specialized propagation elements have to be designed in order to maintain control of the data at locations other than those where a reordering of data is to take place, and also that other processing functions requiring forward field are interrupted. Additionally, the use of a field reversal or stoppage of the magnetic field requires more complex peripheral electronic control circuits and does not permit the use of tank-circuit drives in order to obtain a large magnetic field energy which would be required for large storage capacity.

In addition to the shortcoming described above, the prior art does not take into consideration the introduction of a gap in the data bits which may be produced by different manipulative functions performed on the data. In a text editing system, the gap which is produced when, for instance, data is removed from a line of text, must be adjusted. In the prior art patents where only the order of data is important, no attempt is made to adjust any gap, nor is there any concern about such a gap. In this regard, it should be noted that field reversal does not allow local control in a specified portion of the magnetic chip and is therefore not a technique which can be used to adjust a gap.

In the system proposed herein, these problems are solved using a novel text editing system. Additionally, a constant rotating magnetic field is used at all times in the proposed bubble domain system. Because this is done, the principles shown herein for magnetic bubble domains can be applied directly to charge coupled devices to achieve a corresponding system using charge coupled devices for the dynamic shift register storage. If field reversal were required, as is the case in the prior art, charge coupled devices could not be used. Consequently, the present system embodies broad principles which are applicable both to the magnetic bubble domain technology and to charge coupled device technology which is also a dynamic shift register type of storage.

As will be apparent, the proposed system offers flexible storage structures for facilitating the input, output, retrieval, and revision of data. Additionally, a wide range of data manipulation functions is achieved and the system provides for ready timing controls and charater encoding. In addition to the above, the proposed system can accommodate adjustable line length editing. This feature is important because it is not known in advance, in a text editing system, how much data manipulation will be required.

Accordingly, it is a primary object of the present invention to provide a text editing system using dynamic shift registers, which does not require a reversal or stoppage of the drive fields applied for manipulation of data.

It is another object of this invention to provide a text editing system using magnetic bubble domains.

It is a further object of this invention to provide a text editing system using magnetic bubble domains wherein the magnetic drive field need not be stopped or reversed.

It is a still further object of this invention to provide a magnetic bubble domain text editing system which is totally on the magnetic chip.

It is another object of this invention to provide a dynamic shift register structure which can be sequentially accessed or randomly accessed.

It is still another object of this invention to provide a text editing system using a convertible structure capable of different modes of access.

It is a further object of this invention to provide a dynamic shift register structure which can be accessed in different ways and which can be useful for various input/output functions.

It is a still further object of this invention to provide a text editing system which can be implemented in either magnetic bubble domain technology or charge couple device technology.

It is still another object of this invention to provide a text editing system which can be implemented in magnetic bubble technology or charge couple technology and which can provide selective line editing.

It is another object of this invention to provide a magnetic bubble domain text editing system which can be used to perform editing on a character by character basis or on a line by line basis.

It is a further object of this invention to provide a bubble domain text editing system which can provide ajustable line length for text editing.

It is another object of this invention to provide a dynamic shift register text editing system using a single technology, which minimizes the complexity of peripheral control circuits.

It is a further object of this invention to provide a bubble domain text editing system which permits simultaneous operation of many functions while localized switching functions are occurring at the same time.

It is another object of this invention to provide a text editing system which is flexible and which can be adapted and designed to the user's own requirements.

It is still another object of this invention to provide a text editing system wherein the devices for editing and sorting data and the devices for storing information are compatible in design and can be hosted in the same storage medium to realize an integrated circuit.

BRIEF SUMMARY OF THE INVENTION

This text editing system can be converted from a sequential access to a random access mode or vice versa by various conversion switches thereby providing great flexibility in entry, retrieval, and re-storing of data. The key elements for the editing functions are the freezing and bypassing components. These elements are used to perform basic character element functions of exchange, insertion, and deletion. Moreover, a background/foreground technique is proposed to facilitate line editing functions. In addition, magnetic bubble pointer devices are described for timing control signals and a magnetic bubble encoder is described which enables alphanumerals to be encoded into digital bubble information.

The magnetic bubble domain text editing system described herein consists of four main parts: storages, decoders, switches, and control circuits. The storages consist of a passive part for pages of a text and an active part for data manipulation. A read decoder is used to select a specific page from the passive storage while a write decoder is used to insert new pages into the passive storage. The switches are used to convert the access mode (either random or sequential) and for data flow path or direction. Control circuits coordinate and control the functions of the storages, the decoders, and the switches.

To facilitate data access and manipulation, the text storage space is organized into pages, lines, and characters. The pages can be made contiguous in a storage, thus permitting information to be advanced from page to page. Also, any page can be accessed randomly. When the information at a page is accessed and moved to the active storage area, various types of text editing operations can be performed.

Since the typing or playing back of a text is sequential, while the retrieval of a page for revision or restoration of a revised page is selective, the passive storage is designed such that any page can be stored, retrieved, or restored either by sequential access or by random access. However, the manipulation of characters and lines within the active storage is basically sequential. Consequently, the design presented shows a sequential access for the active storage. Means are provided in the active storage for advancing or backspacing information in that storage.

Random access is enabled by the decoders while sequential access is provided naturally by the shift registers. Conversions from one access mode to another in the passive storage, and between advance and backspace in the active storage are controlled by groups of conversion switches.

These features, advantages, and objects will be more apparent from the following more particular description of the preferred embodiments.

BRIEF DESCRIPTION OF THE DRAWINGS

FIGS. 3A, 3B, and 3C illustrate operations of the convertible structure of FIG. 1, to achieve idle, sequential access, and random access, respectively.

FIGS. 4A, 4B, and 4C illustrate various operations of the active storage in the system of FIG. 1.

FIG. 5B shows a single level metallurgy configuration which can be used to implement a convertible structure.

FIGS. 6A, 6B, and 6C show various embodiments for the editing shift register of FIG. 1. In particular, FIG. 6A shows diagrammatically the functions of this editing shift register, while FIGS. 6B and 6C show actual overlay configurations for implementing the editing shift register.

FIGS. 7A–7D illustrate the use of freeze and bypass functions to achieve bit position interchange in the editing shift register. FIGS. 8A and 8B show a modified active storage which is useful for manipulation of lines of data.

FIG. 8C shows an overlay configuration for the modified active storage of FIGS. 8A and 8B.

FIGS. 10A – 10C schematically illustrate character operations using bubble domain pointers, while

FIGS. 11 – 11C illustrate the use of pointers to enable any type of control function in a user-specified mode of operation.

FIG. 12C is an overlay implementation for the encoder of FIG. 12A, using current controlled switches.

DETAILED DESCRIPTION OF THE PREFERRED EMBODIMENT

Figure 1:
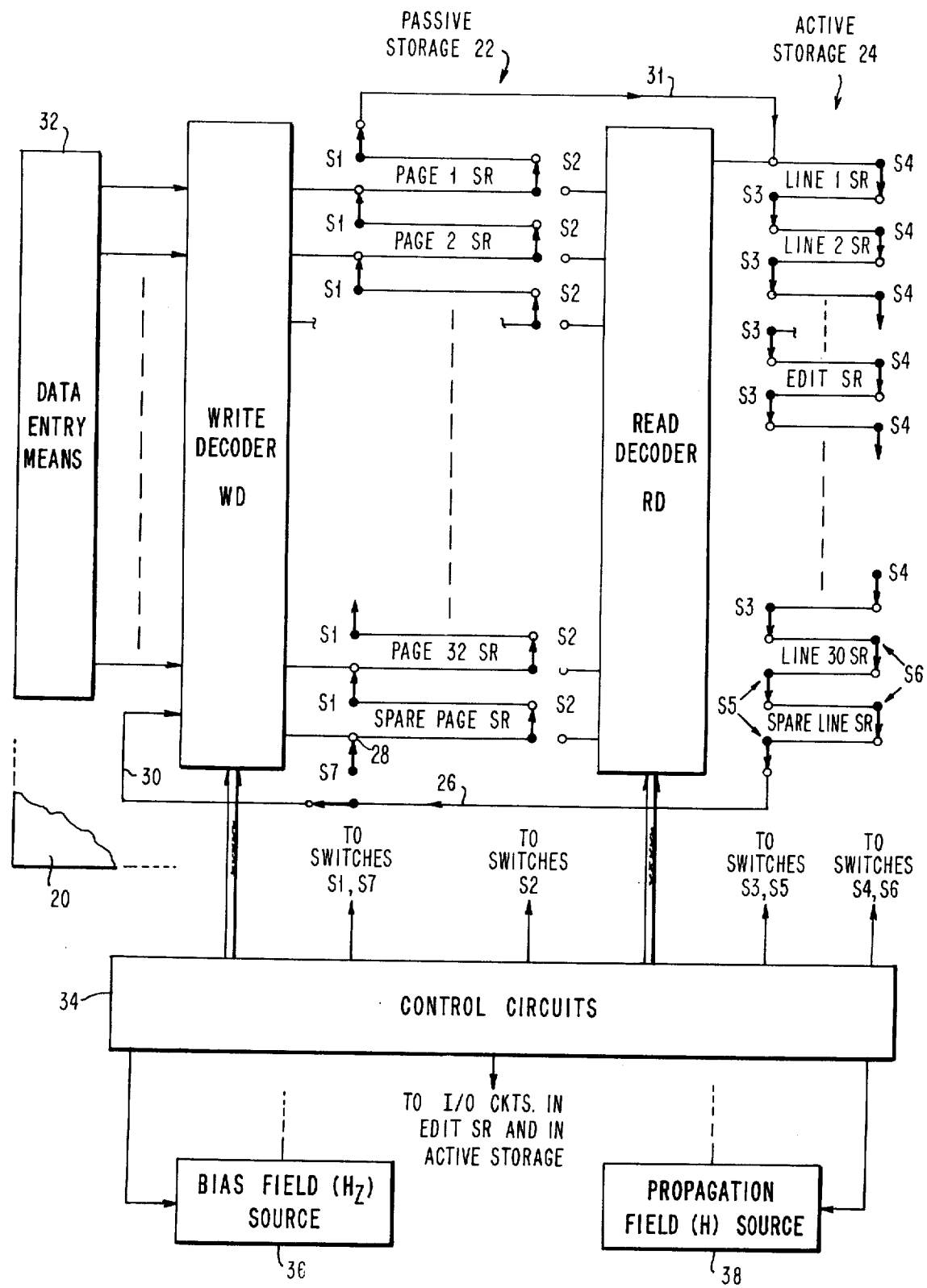
FIG. 1 is a diagram of a text editing system using a convertible structure for greater flexibility and improved operation.

A system will be described using magnetic bubble domains for various data manipulation functions, control functions and input/output functions. Although magnetic bubble domains will be utilized as the data bits, it will be appreciated by those of skill in the art that the movement of charge by charge coupled devices is analogous. Therefore, the concepts presented herein can also be achieved using charge coupled devices. Basically, this is possible because all of the bubble domain manipulative functions are performed without requiring the need for a reversal in the in-plane, magnetic drive field.

Devices will be shown for storage and text editing, as well as for data sorting, address decoding, character encoding, and timing signal initiation. To describe these devices and their operation, the remainder of this specification is divided into five main topical areas: Introduction, system Organization, Data Manipulation, Control and Input/Output, and Hardware Considerations.

I. INTRODUCTION

The specification will describe a bubble domain system that can perform many functions. In particular, a text editing system will be described, although people having skill in the art will readily appreciate that components in this overall system can also have utility in applications other than text editing. For example, the convertible structure to be described hereinafter is very useful in many storage applications where it may be desirable to have a structure which can be sequentially addressed or randomly addressed. Another component having advantageous utility apart from a text editing system is the editing shift register, which provides many data manipulation functions. In contrast with the prior art, this shift register can create data gaps and can close these gaps which cannot be done with a reversal or stoppage of the reorientating magnetic drive field used to move magnetic bubble domains.

As has been mentioned, the components of this system preferably operate under the control of a rotating in-plane magnetic drive field. Since the rotating field need not be reversed to achieve all functions described herein, the teachings herein are applicable to other than purely bubble domain components. For example, charge-coupled devices are dynamic shift registers which continually move charge in a semiconductor medium. Charge coupled devices which are analogous to the bubble devices shown in the present application can be used to perform the same functions, since these are charge moving devices which do not use reverse polarity drive signals. Aforementioned copending application Ser. No. 469,926 describes a system using charge coupled devices, and that teaching is incorporated by reference herein.

In the system to be described, a passive storage structure can be converted from sequential access to random access or vice versa by bubble conversion switches, thus providing great flexibility in entry, retrieval, and restoring of data. The key elements to be described for all editing functions are the "freezing" and "by-passing" bubble domain devices. These key elements are adequate to perform basic character editing functions of exchange, insertion, and deletion. Moreover, a technique in which information is divided into a "background portion" and a "foreground portion" is described for facilitating line editing functions (topic III). Keyboard operations are also analyzed for direct entry of data or operations into a bubble domain environment. Further, a bubble domain pointer device will be described which is used to emit timing control signals. A magnetic bubble domain encoder is later described which is used to encode alphanumeric information into digital bubble information (topic IV). In topic V, hardware considerations are described. These considerations include the choice of editing devices without requiring stoppage or reversal of the rotating drive field, and an integrated circuit approach to bubble chip design which leads to minimal pin connections.

II. SYSTEM ORGANIZATION

FIG. 1 shows the overall system organization which can be used to achieve text editing. The system comprises four main parts: storages (both active and passive), decoders, conversion switches, and control circuits. The storages consist of a passive storage for storing pages of a text, and an active portion for data manipulation. A read decoder is used to select a specific page from the passive storage, while a write decoder is used to insert new pages from the passive storage. These decoders are well known in the art and reference is made to U.S. Pat. No. 3,701,125 and U.S. Pat. No. 3,689,902. These decoders will not be described in detail in this application, since they are well described in the aforementioned patents. The conversion switches are used to convert operation of this system to a random access mode and to determine data flow paths or directions. The control circuits coordinate and control the functions of the storages, the decoders, and the switches.

Referring now in more detail to FIG. 1, various devices are shown for manipulation of magnetic bubble domains in the magnetic medium 20. This magnetic medium can be any medium which can support magnetic bubble domains, as for instance garnet materials and amorphous magnetic materials.

The passive storage 22 is comprised of a plurality of shift registers for storing pages of a text which are indicated as pages 1–32 in FIG. 1. These shift registers are connected to a write decoder WD on one side and can be selectively connected to a read decoder RD on the right hand side of each register. Conversion switches S1 are used to sequentially connect the page shift registers or to disconnect the page shift registers from one another, as will be explained in more detail with respect to FIGS. 2A – 2C. Conversion switches S2 are used to selectively connect each page shift register to a read decoder RD for random access of information in any selected page shift register.

Spare page shift registers are also provided. The number of these page shift registers can be varied, and only one is shown in FIG. 1. As will be appreciated later, these spare shift registers can be used when it is desired to interchange two pages of data.

The active storage 24 is comprised of a plurality of line shift registers which can individually store the line of information from any page of the text. One of these line shift registers, called the editing shift register, is the register in which data manipulation can take place. If desired, this editing shift register can be longer than the line shift registers, in order to be able to accommodate more than one line of text.

Spare line shift registers can be provided, one of which is shown in FIG. 1. These spare line shift registers can be used when data is being advanced to create a gap, or when it is desired to interchange the data in any two lines. These operations will be explained more fully in topic III (data manipulation).

Switches S3 are located on the left-hand side of each line shift register while switches S4 are located on the right-hand side of each register. These switches can be used to connect the line shift registers for advancing data, or for causing the line shift registers to be disconnected from one another, when it is desired to "freeze" (i.e., idle) the data. The switches S5 and S6 are basically the same as switches S3 and S4. However, they are controlled separately from switches S3 and S4, as will be more fully apparent from the discussion with respect to FIGS. 8A and 8B.

A bubble propagation return path 26 is used to bring bubble domains from the line shift registers to a conversion switch S7. Depending upon the activation of switch S7, these bubble domains will either be returned to the page shift registers via path 28, or be sent to the decoder WD via path 30. The domains are sent to decoder WD when it is desired to place them in different page shift registers than those in which they were previously placed. Propagation path 31 is used to connect the page shift registers sequentially to the line shift registers in the active storage 24.

A data entry means 32 is used to provide the initial data to be placed into the page shift registers. This entry means can comprise a bubble domain encoder (to be described later), or any other circuitry which will provide bubble domains to the write decoder.

The entire system is under control of the various control circuits 34. These circuits provide synchronizing controls to the write decoder, read decoder, and to the switches S1, switches S2, switches S3, switches S4, switches S5, switches S6, and switch S7. In addition, the control circuits provide clocking and synchronizing inputs to the I/0 circuits located in the editing shift register (FIGS. 6A–6C), to the read/clear station 66 and write station 68 (FIGS. 8A–8C), and to the bias field source 36 and propagation field source 38. These field sources produce magnetic fields $H_z$ used to stabilize the size of the bubble domains and H for moving domains in the magnetic medium 20. The field sources 36 and 38 are well known in the art and will not be described further.

In the system of FIG. 1, data access and manipulation is facilitated by the system organization in which the text storage space is organized into pages, lines, and characters. It is assumed that there are 32 pages per storage, 30 lines per page, and 80 characters per line. These pages can be made contiguous in the storage, thus permitting the information to be advanced from page to page. Additionally, any page can be accessed randomly through the use of conversion switches S2. When the information at a page is accessed and moved to the active storage area, various types of text editing operations can be performed. Typically, there are nine bits per character (8 information bits and 1 parity bit) which are distributed on nine separate magnetic bubble domain chips.

A bit organized memory is used since this is amenable to error detection and correction. For a text editing system, the bit organization has an added advantage, namely that the number of bits per character may be varied to adapt to different character sets without varying the device chip configurations. For example, the ASCII or EBCDIC code has eight bits per character and hence requires only eight magnetic chips for this type of organization. Here, a magnetic chip is described as a complete functional unit having structure for movement of bubble domains and for stabilizing the diameter of these domains. If a different character set requires more bits per character, additional magnetic chips can be used while still sharing the same control circuits.

FIG. 2

The typing or playing back of the text in storage is sequential, but the retrieval of a page for revision or for the restoration of a revised page is selective. Consequently, a convertible structure has been provided in this system. That is, the passive storage is designed so that any page can be stored, retrieved, or restored either by sequential access or by random access. The manipulations of the characters and lines within the active storage 24 are basically sequential. Hence, only sequential access is provided for the active storage.

The lines in the active storage must also be able to advance or backspace. This operation is described more fully with respect to FIGS. 2A – 2C and FIGS. 8A – 8C.

Random access of the page shift registers is enabled by the on-chip decoders WD and RD. The sequential access is provided naturally by the shift registers themselves. Conversion from one access mode to another in the passive storage 22, and line advance and backspace in the active storage is controlled by the conversion switches S1 – S6.

FIGS. 2A, 2B, 2C

Figure 2A:
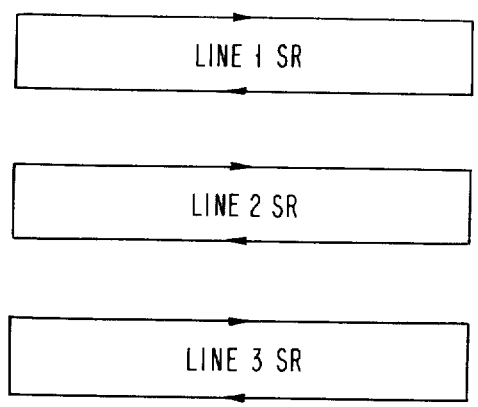
FIGS. 2A, 2B, and 2C illustrate the cpabilities of the convertible structure in the system of FIG. 1.

These figures illustrate the types of operations which can be performed in the active storage 24. For instance, FIG. 2A shows that the various line shift registers can be made to individually idle. That is, these line registers (three of which are shown here) can be disconnected from one another so that information is around a closed loop defining each register. To achieve this, the switches S3 and S4 are suitably controlled by current conductors from the control circuits 34. In this case, switches S3 are all up while switches S4 are all down.

Figure 2B:
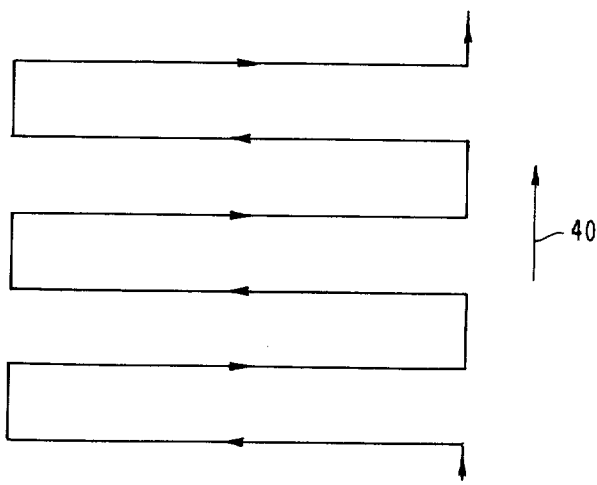
Figure 2C:
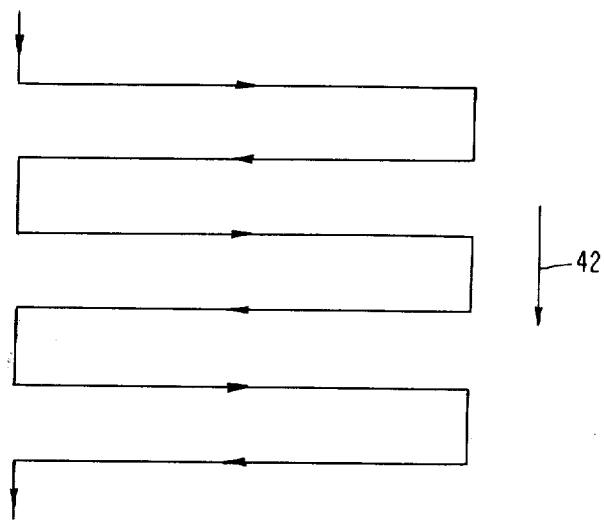

The lines in the active storage must also be able to advance or backspace. These operations are illustrated by the serial connections shown in FIGS. 2B and 2C. In FIG. 2B, the flow of data in the active storage is upward as indicated by arrow 40, while in FIG. 2C, the flow of information in the active storage is downward as indicated by arrow 42. Data flow in these serial connections is determined in accordance with the switches S3 and S4. In FIG. 2B, switches S3 are in their up positions so that bubble domains flow upward through the switches while switches S4 are also in their upward positions so that bubble domains flow upward through these switches. In FIG. 2C, the switches S3 and S4 are directed downwardly (that is, bubble domains flow donwardly through these switches).

Figure 3A:
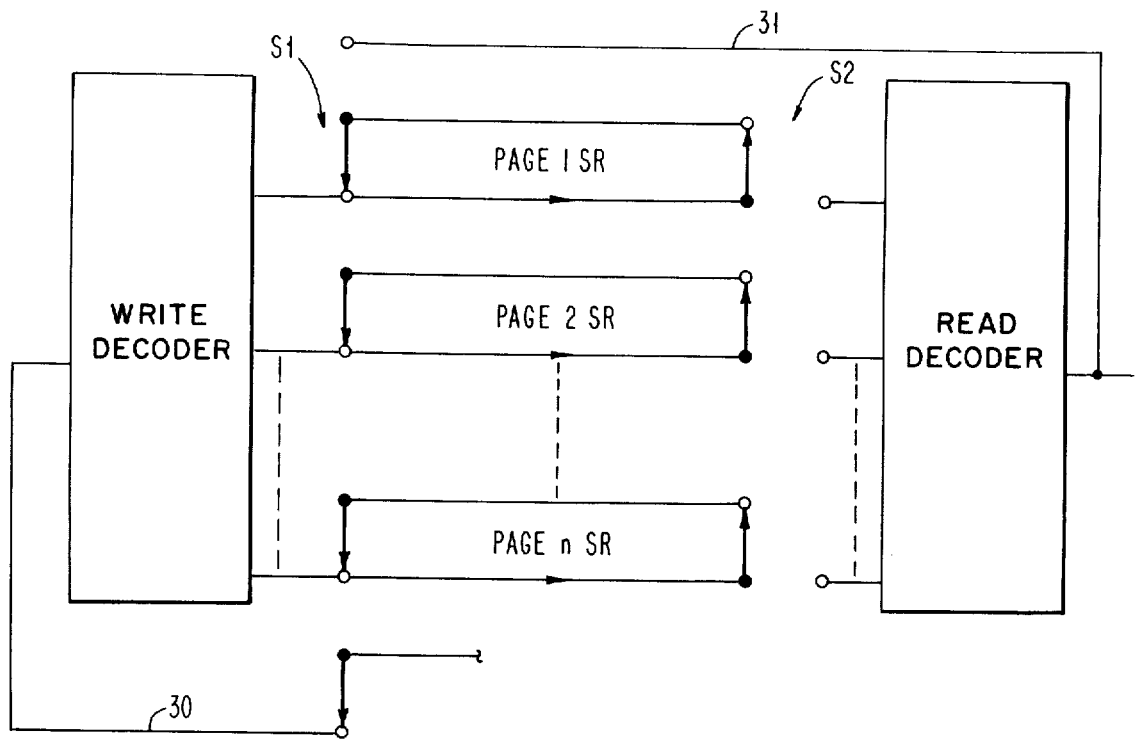
Figure 3B:
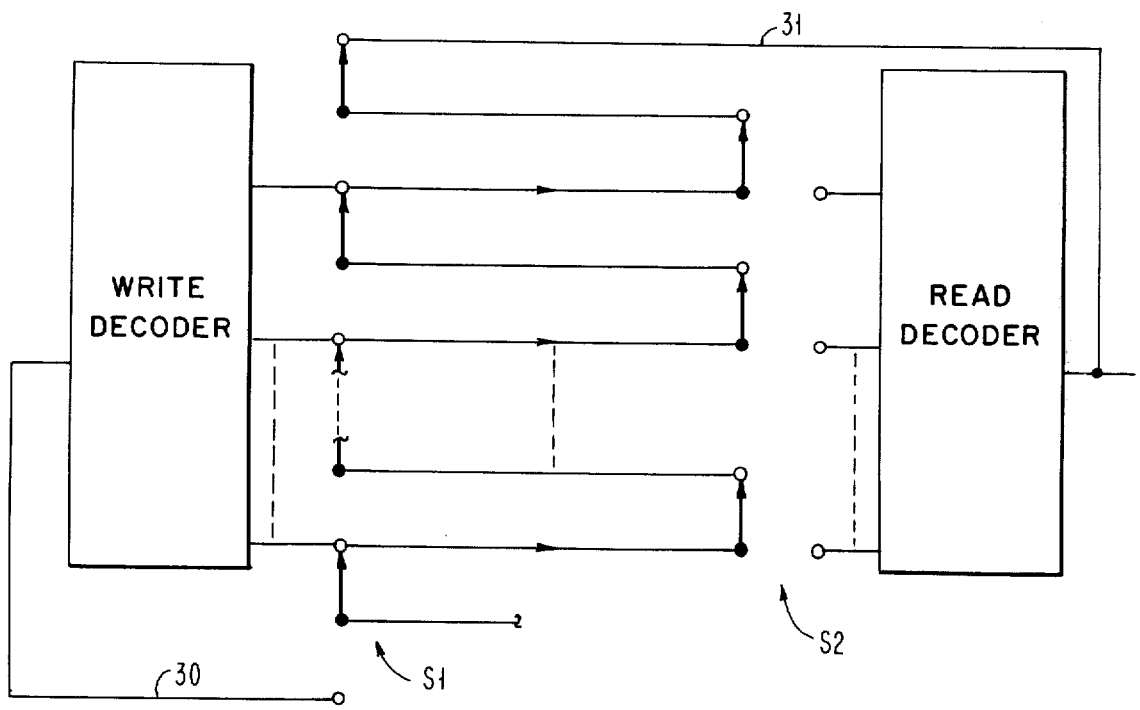

PASSIVE STORAGE (FIGS. 3A, 3B, 3C). The passive storage 22 is comprised of the page shift registers which are longer than the line shift registers 24 of the active storage. There are two groups of single pole, double throw switches S1's and S2's which control the connections of the shift registers. Each shift register is permanently connected to write decoder WD at the left-hand side and can also be connected to a read decoder RD at the right-hand side by the switches S2, as shown in FIG. 3C. All switches on the same side of the shift registers are activated simultaneously.

FIG. 3A shows the connection of the various switches S1 and S2 to have the page shift registers idling in isolation. That is, these page shift registers are unconnected from one another and data in the registers continually recirculates without moving to a different register. Without activating the current inputs to the switches from the control circuits, switches S1 remain in the down positions and switches S2 remain in the up positions for this idle operation.

When the switches S1 and the switches S2 are set in their up positions, both the read and write decoders are bypassed, as is shown in FIG. 3B. The passive storage and the active storage are then connected in a closed loop via path 31 for the sequential access mode of operation. In this situation, pages can be retrieved from or restored into the passive storage directly and sequentially.

FIG. 3C shows the state of the switches S1 and S2 in order to achieve random access operation. This is useful for retrieving or restoring a page quickly. For this operation, switches S2 are set in their right-hand positions while switches S1 are in their downward positions. The address of the requested page is applied to the read or write decoder. Thus, a page space in the passive storage is connected to the active storage by the decoders and the information is transferred between the active and passive storage.

ACTIVE STORAGE (FIGS. 4A–4C)

The active storage consists of the line shift registers 24, each of which stores a line of data. Consecutive line shift registers can be serially connected by convertible switches S3 and S4 located at the ends of the line shift registers. The active storage has an I/0 position 43 at the leading bit position where data can be written in, read out, or cleared from the active storage. For the convenience of the following description, a character which can be manipulated when it is moved to the I/0 position is called an active character. A line of data containing the active character is called an active line, while a page of data residing in the active storage is termed an active page.

In FIG. 4A each of the line shift registers is isolated from one another, thus showing the switch locations when information in the line registers is idling. This situation occurs when the conversion switches S3 and S4 are not activated by current control loops used to change their state. The switches S3 remain in the up positions (i.e., bubble domains flow upwardly through the switches) while switches S4 are in the down position. In this situation each shift register circulates data by itself, and the active storage is waiting for control signals to initiate data manipulations.

The use of the convertible switches S3 and S4 allows lines to be advanced or backspaced without reversing the rotating magnetic field used to move the magnetic domains in medium 20. This operation was illustrated in FIGS. 2B and 2C and will not be discussed in detail here.

Figure 4B:
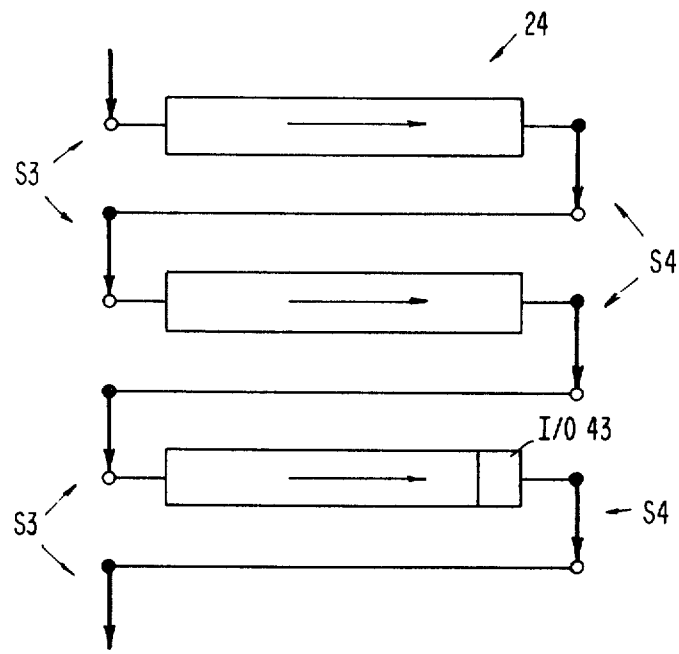
Figure 4C:
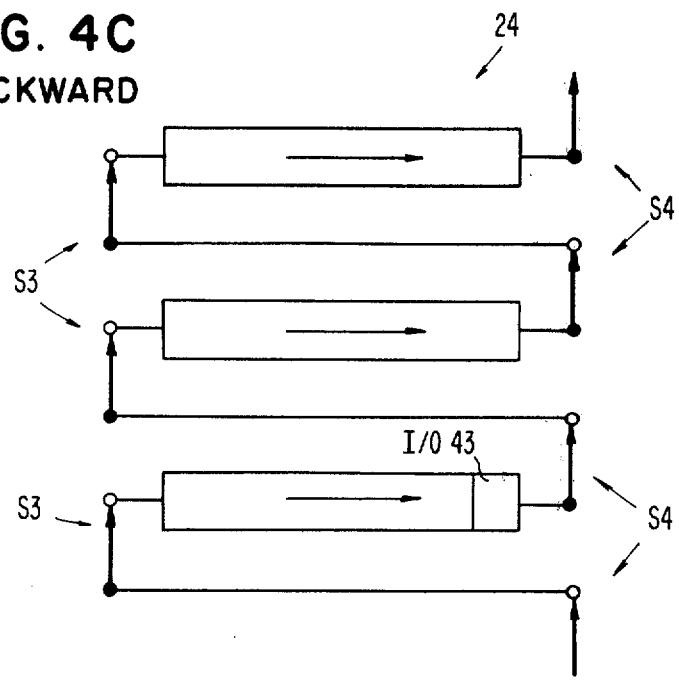

In FIG. 4B, the lines of data are advanced in a forward direction by setting the switches S3 in the down positions. The switches S4 remain in the down positions. To backspace (FIG. 4C), the switches S4 are set in the up positions. The actual overlay pattern design (to be described later) provides equal delays through the various propagation lines for different modes of operation.

SWITCH CONFIGURATION (FIGS. 5A, 5B)

FIG. 5 shows one embodiment of the conversion switches used in the active and passive storage. In this embodiment, page shift registers are shown, but the same embodiment can be used for the line shift registers of the active storage. In FIG. 5, data flows in a clockwise direction through the page shift registers, in distinction from the counterclockwise flow of data in the page shift registers of FIG. 1. However, the principle of operation of the conversion switches is the same in both cases.

The propagation elements for the shift registers are the permalloy patterns 44–1, 44–2, etc. These patterns are comprised of standard permalloy T and I bars, as is well known in the art. Any type of soft magnetic material can be used for these patterns and the shape of the propagation elements can be changed as is also known in the art.

The switches S1 and S2 are comprised of permalloy elements used to move the bubble domains and current loops 46 and 48, respectively. These conductors 46 and 48 are superimposed on the permalloy patterns and are used to provide localized magnetic fields for controlling the movement of magnetic bubble domains. As will be appreciated, this design provides equal delays through the various shift registers for different modes of operation.

Without being activated by current in the loops 46 and 48, switches S1 remain in the up positions while switches S2 remain in the down positions. The operation of the switches S1 and S2 will now be described more fully with respect to FIGS. 5A, 5B. At the left-hand side of the shift registers, a bubble domain at position A will travel to position C' in two cycles of rotation of the in-plane propagation field H. However, when current is passed through conductor loop 46 during phase 3 of field H, a bubble domain at A will be held there and will then travel downwardly and arrive at C''. The movement of the domain from position A to position C'' also requires two rotation cycles of field H. Therefore, the delays are equal regardless of the state of the switches S1 and S2. A similar operation occurs for activation of current loop 48 for changing the state of switches S2.

Figure 5A:
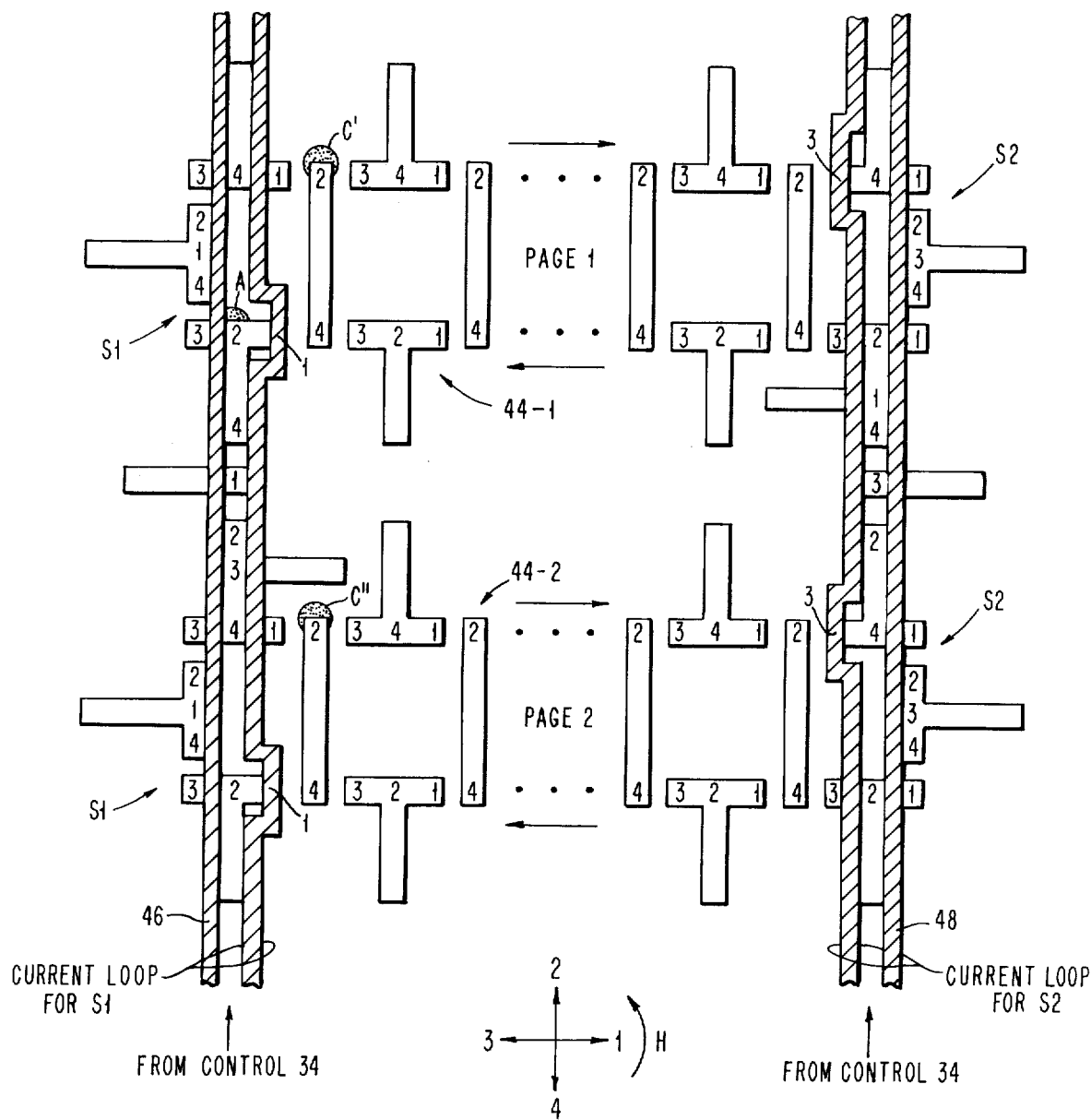
FIG. 5A shows an overlay configuration used to achieve a convertible structure.

FIG. 5B shows a single level metallurgy device design for achieving the functions of the structure shown in FIG. 5A. In this design, the current loops 46 and 48 are comprised of a conducting material which is deposited directly on the permalloy overlay elements. Thus, the same mask can be used in order to facilitate processing.

As is the case with the embodiment of FIG. 5A, the single level design of FIG. 5B can be used to move a bubble domain from position A to position C' or from position A to position C'' depending upon activation of the current loop 46. These switches are designed to provide bubble domain control during phase 3 of the rotation cycle of the field H. Further, their design is such that current flow through the conductor loops will not hinder the propagation of bubble domains through the shift register paths.

III. DATA MANIPULATION (FIGS. 6A–6C, 7A–7D, and 8A–8C)

The editing of text includes the alteration of the substance of the contents of the text and the rearrangement of the order of the contents of the stored text. Alteration consists of clearing and writing data which involve input/output operations. The rearrangement of data order consists of positioning, deletion, insertion, and exchange of characters or lines. These operations will be described in more detail with respect to FIGS. 6A - C, 7A - D, and 8A - C.

In the design of FIG. 1, editing functions can be performed in the active storage. The positioning of the line for editing is achieved by advancing or backspacing the contents of the active storage registers. The deletion, insertion, or exchange of data always requires the displacement of a data section from the rest of the data. Deletion of a bit of information is synonomous to clearing the information and then closing the gap which has been left. Insertion of a data bit is the creation of a bit space and then the writing of a bit into that space. Dynamic shift registers, such as magnetic bubble domain shift registers and charge coupled device registers, continuously circulate all the data stored in them. Hence the relative displacement of data is achieved by temporarily freezing a section of the stored data.

EDITING SHIFT REGISTER

The editing shift register is shown schematically in FIG. 6A. This register is provided with two alternate paths, a normal path 50 and a bypass path 52. Bubble domains usually move along the normal path. In this figure, bit positions are schematically indicated by the blocks having the bits A, B, C, etc. in them.

A bit is written, cleared, or read at a convenient position (called the I/0 position 54). Any number of I/0 positions can be utilized and the position of these I/0 stations is arbitrary.

Rearrangement of data order is performed by freezing a bit (or bits) at the I/O station, alternated with de-freezing the bits at the I/0 station and then allowing these frozen bits to revert to their normal propagation path. Before those bits are de-frozen, they may be altered at the I/0 station by electronic or magnetic means. Other data is diverted to the bypass path 52 where it can move past the frozen bits in the I/0 position. When the previously frozen bits are de-frozen, they will continue propagating in the shift register, but will have a different position relative to the other bits in the shift register than they had previously.

FIG. 6B shows a design for achieving freeze and bypass operations. In this case, a magnetic bubble domain shift register is comprised of T and I bars 54, together with two Y bars 56 and 58. These Y bars are used for cornering. Two current loops 60 and 62 are used for bypassing and freezing bits of data respectively. The current conductor loops 60 and 62 receive inputs from the control circuits 34 (FIG. 1). A writing means 61 is comprised comprised the permalloy domain generator G, a permalloy I-bar 63, and a write control loop 65, which receives current inputs from control circuits 34. Domains produced by generator G will move to pole 4' on Y-bar 56, unless they are annihilated by a field produced by current in conductor 65.

FIG. 6C shows a single level metallurgy configuration for achieving an editing shift register structure. Here, the register is comprised of a T and I bar pattern 54 which is similar to the pattern shown in FIG. 6B. However, the bypass loop 60 and the freeze loop 62 are conductors which are deposited directly on the permalloy Y bar elements 56 and 58. Current through the conductor loops 60 and 62 will not impair the movement of bubble domains around the shift register. For ease of illustration, the writing means 61 is not shown in FIG. 6C.

Figure 7B:
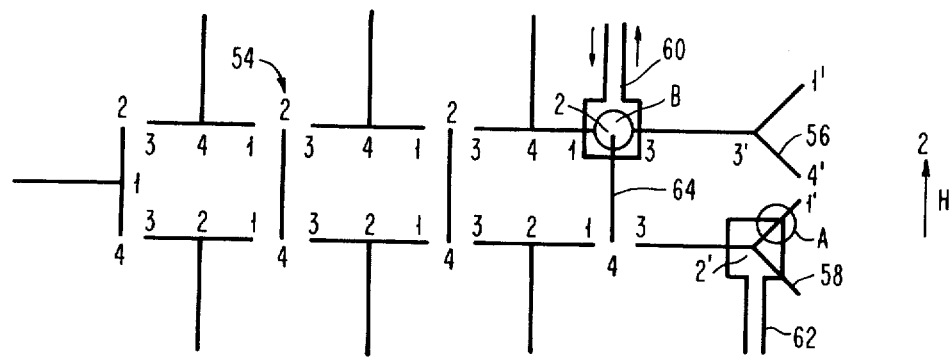
Figure 7C:
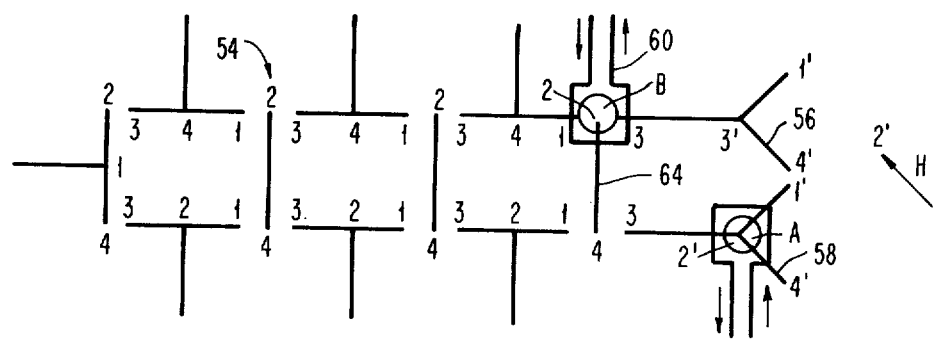
Figure 7D:
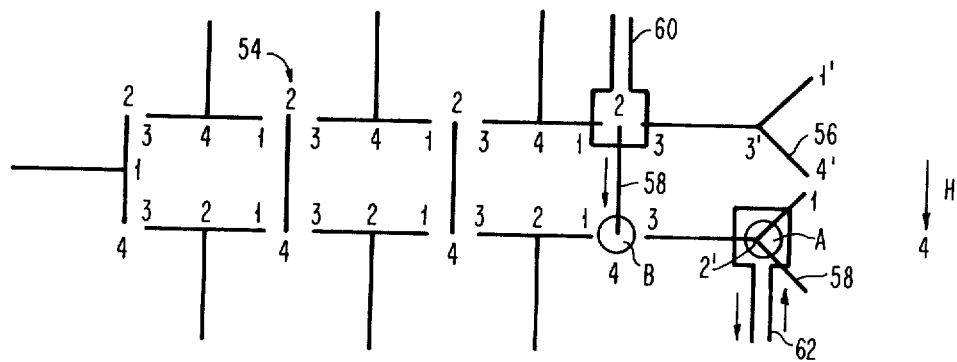

FIGS. 7A - 7D show the movement of bubble domains during one rotation of the in-plane magnetic field H, when freezing and bypassing operations are executed. Initially, bubble domain B follows bubble domain A in a clockwise direction around the shift register. During phase 1 of the drive field H, bubble domains A and B reside at the positions shown in FIG. 7A. From phase 2 through phase 3' (see FIG. 6), the bypass current loop 60 is activated to retain bubble B within loop 60 (FIGS. 7B and 7C). During phase 4 of field H, the bypass current in loop 60 is removed to allow bubble B to slide down I bar 64, thus achieving bypass (FIG. 7D).

A freezing current is applied starting at phase 2' of field H and is continually applied for one complete field rotation cycle. At that time, the freezing current in loop 62 is removed which allows bubble A to follow bubble B around the editing shift register.

In the editing shift register I/0 position, a sensor is easily provided for detection of the information. Additionally, a generator can be provided for insertion of new information. Current through the freeze loop 62 can be increased in value in order to collapse (delete) a bubble domain held there. Thus, the I/0 position can be used for the location of a plurality of components for changing the data order or for changing the data itself.

CHARACTER MANIPULATION

In this section, the exchange, deletion, and insertion of characters within a single line will be considered. A line which is to be changed is first moved to the active line position, i.e., the line is moved into the editing shift register. As noted, the editing shift register is equipped with freeze and bypass current loops as well as being equipped with a generator for inserting new information. Deletion of information can be achieved by annihilating the information using a current loop, or by using an increased current magnitude in the freeze loop. For illustration in the following examples, an 8-character line having the initial status shown in FIG. 6A is assumed for the examples which are summarized in TABLE 1. Character A is assumed to be the beginning of that line and only one direction of shifting (clockwise) is permitted. The examples described in TABLE 1 will be explained in more detail, especially with reference to FIGS. 6A, 6B, and 7A - 7D.

TABLE 1

CHARACTER MANIPULATION
The rightmost bit is amenable to freeze action, while its adjacent bit is amenable to bypass action.

| Examples | SR Actions | SR Status |
|---|---|---|
| 0. Initial status (see FIG. 6A) | 1. Quiescent | EDCBA_H_ |
| 1. Exchange B and C | 1. Shift 4 bits | A_H_EDCB |
| | 2. Freeze and bypass 1 bit | CA_H_EDB |
| 2. Extract and insert B between D and E | 1. Shift 4 bits | A_H_EDCB |
| | 2. Freeze and bypass 2 bits | DCA_H_EB |
| 3. Close gap between E and H | 1. Freeze and bypass 1 bit | HEDCBA_ _ |
| 4. Delete C and close gap | 1. Shift 5 bits | BA_H_EDC |
| | 2. Annihilate | BA_H_ED_ |
| | 3. Freeze and bypass 4 bits | H_EDBA_ _ |
| 5. Insert a space between B and C | 1. Shift 2 bits | H_EDCBA_ |
| | 2. Freeze and bypass | BAH_EDC_ |

TABLE 1-continued

CHARACTER MANIPULATION
The rightmost bit is amenable to freeze action, while its adjacent bit is amenable to bypass action.

| Examples | SR Actions | SR Status |
|---|---|---|
| 6. Insert F between B and C | 2 bits<br>1. Shift 2 bits | H_EDCBA_ |
| | 2. Freeze and bypass 2 bits | BAH_EDC_ |
| | 3. Write | BAH_EDCF |

EXCHANGE OF CHARACTERS

Example 1 in the table describes the exchange of two adjacent characters B and C. To do this, the editing shift register is shifted by 4 bits to bring character B into the I/0 station. The freeze and bypass loops 62 and 60 are then activated for one cycle of the field H. That is, character B is frozen for one cycle of field H and then defrozen, and only character C is allowed to bypass character B. This is equivalent to an extraction of B and a reinsertion of B between characters C and D.

Similarly, B can be inserted into any other desired position. For example, example 2 of the table describes the situation when B is extracted and then reinserted between D and E. In this example, the freeze and bypass loops are activated for two cycles of the field H to allow B to exchange with C and then with D. From this, it is obvious that the operation of extraction and reinsertion of a character into any position can be applied repeatedly for the purpose of sorting the characters in a line into any desired order. Thus, the editing shift register can be used to rearrange the order of data into any desired sequence.

DELETION OF CHARACTERS

Since no bit positions are removed or created in a shift register during its operation, the removal of a space is interpreted as the movement of that space to the end of the line (i.e., the position preceding A). In FIG. 6A, the character preceding A is indicated as a blank box indicative of the space. This is illustrated by example 3 of the table where the gap is closed between characters E and H. To do this, the shift register freezes and bypasses 1 bit to achieve the shift register status HEDCBA.

In example 4 of the table, C is brought to the I/0 station by shifting it five bit positions. In the I/0 station it can be annihilated conveniently by passing a large current through the freeze loop 62 when C is in that loop. As an alternative, another conductor loop can be used to annihilate bits which ae in the I/0 position. The space left by the deletion of character C is then inserted at the end of the line by freezing and bypassing four bits, as shown in the table. Similarly, any number of characters can be deleted by placing these characters into the I/0 position, annihilating the characters, and then closing the gap as explained previously.

INSERTION OF NEW INFORMATION

To insert a new bit into a line is interpreted as extracting a space at the end of the line (i.e., the space preceding A) and reinserting that space into the desired position in order to write in the new bit at the space. Therefore, it is assumed that the last character of the line is a space to accomodate insertion of new information without losing old information (FIG. 6A).

Example 5 of the table shows that a space between A and H is extracted and reinserted between B and C, by shifting two bits so that the space is brought into the I/0 position, followed by a freezing of that space and a bypass of two bits (A and B) past this space. The space is then returned to the shift register, being then in a position between B and C.

Example 6 illustrates the insertion of a new character F in the space now created between B and C. As described, a space is created between B and C (Example 5) after which the newly inserted space is moved to the I/0 station where character F is written in. This writing operation is performed by the generator G, in combination with I bar 63 and I/O control line 65 (FIG. 6B).

LINE MANIPULATIONS (FIGS. 8A – 8C)

Quite often, the editing of data involves the rearrangement of data in many consecutive lines. For example, when half a line is deleted from one line, the information in all subsequent lines within the same paragraph must all be advanced by half a line into their preceding lines. A simple modification of the active storage will enable data manipulation within many consecutive lines.

The entire active storage (a page) can be serially connected by the switches S3, S4, S5, S6, etc. These switches are connected in a manner which defines the active storage into separate portions. The separate portions are divided by the I/0 stations (read/clear and write stations). The two portions into which the active storage is divided are the background and foreground portions. This division is achieved with two corresponding groups of conversion switches which are controlled by separate conductors. These groups of conversion switches are the same as the conversion switches described previously except that conversion switches in the first group (S3 and S4) are activated by a first set of conductors while the conversion switches in the second group (S5 and S6) are activated by another set of conductors.

The read/clear station 66 is located at the leading bit position of the first line in the background area, while the write station 68 is located at the trailing bit position of the last line in the foreground area.

For deletion of a line, the line is brought to the active line position by advancing or backspacing the foreground area and the background area simultaneously. At this time, the background data is advanced to be cleared in tne read/clear station 66 while the foreground data is idled in the separate shift registers in the foreground area. This is illustrated in FIG. 8A, where the background data is advanced in the direction of arrow 70 into the read/clear station 66 where it is sensed and then annihilated. At the same time, the information in the foreground area idles in the separate and unconnected line shift registers. Of course, this is achieved by the activation of switches S5 and S6 to isolate the line shift registers in the foreground portion.

More than one line of data can be deleted from the active page in the same way. That is, additional lines of data are advanced in the background portion of the active storage to the read/clear station 66 where it is detected and then annihilated.

Insertion of a line is explained with reference to FIG. 8B. In this situation, the background portion of the data must be held (idled) while the foreground portion is advanced in order to create a gap into which the new information can be written by the write station 68.

Referring more particularly to FIG. 8B, insertion of a line of data is achieved by advancing or backspacing the background area and the foreground area simultaneously. This brings the desired region for insertion of data to the active line position. At this point, switches S3 and S4 are activated to hold the background information. That is, the background line shift registers are isolated from one another so that the information in these registers merely circulates in these registers without advancing. While the background data is held idle, the foreground data is advanced in the direction of arrow 72 in order to make room for the insertion of new data by the write station 68. Of course, more than one line of data can be inserted into the active page in the same way.

FIG. 8C shows an overlay embodiment for implementing the read/clear station 66 and the write station 68. In this design, two line shift registers are shown, the read/clear station 66 being at the end of the background area while the write station 68 is at the leading bit position of the foreground data area. The current loop for the various switches S3 is the conductor 74, while the current loop for the switches S4 is the conductor 76. The current loop for switches S5 is the conductor 78 while the current loop for the switches S6 is the conductor 80. All of these current loops receive current inputs at the proper time from the control circuits 34 (FIG. 1). The propagation circuit for the shift registers in the active storage is comprised of permalloy T and I-bar patterns as are well known.

Depending upon the activation of the switch S3, a bubble domain at A will either move to position C' or to position C'' on two cycles of the rotating field H, as has been explained previously. When current is passed through conductor 74, the bubble domains can be made to move from position A to position C'', which will bring them past the read/clear station 66. This station 66 is comprised of a read control conductor 82, and a permalloy propagation pattern generally designated 84. Additionally, a sensor 86 and an annihilator 88 is provided. Sensor 86 is any type of well known bubble domain sensor, such as a magnetoresistive sensor, which is connected to utilization means 90. Means 90 can be any circuit responsive to an electrical signal from sensor 86, such as a data processing apparatus. Annihilator 88 is comprised of an L-bar of permalloy which will collapse bubble domains when they are trapped at its elbow.

In operation, a current through the read conrol conductor 82 will cause bubble domains located at position 1 of T bar 92 to move to position 2' on this T bar when field H is in direction 2. That is, current through conductor 82 will prevent the domains at position 1 of T bar 92 from following a downward path to the next line shift register. The domain which is at position 2' on bar 92 then moves to the left past sensor 86 where it is detected. After being sensed, the domain moves to annihilator 88 where it is destroyed and thus cleared.

The write station 68 is comprised of a bubble domain generator 94, which is a well known permalloy generator. Domains are produced at pole position 1 of permalloy 94 in response to the movement of the rotating field H. These domains propagate to the right to enter the line shift register via permalloy element 96. However, a pattern of bubble domains and voids can be created by passing a current through the write control conductor 98. Thus, a plurality of characters can be entered into the shift register by selective pulsing of conductor 98.

The read control conductor 92 and the write control conductor 98 receive current inputs from the control circuits 34 shown in FIG. 1. In particular, these inputs are among those provided to the I/O circuits in the editing shift register and in the active storage.

DATA SYNCHRONIZATION

When portions of the text are idled and others are advanced, the readvancement of the idling portion should to take place at the proper time to insure that the data remains in the same order. For instance, when a line is deleted (FIG. 8A), the foreground information is idling in the line shift registers while the background information is advancing and being cleared by station 66. After the desired amount of information has been cleared from the background portion of the data, the foreground information can be connected and advanced through the active storage. However, this serial connection to restart the advancing of data in the foreground information must occur at a proper time so that the order of the data remains as it was before the line modification (deletion) was initiated.

This synchronization of the data ordering is under control of the circuits 34 (FIG. 1). These circuits do not initiate the advancement of data in the foreground portion until a time when that advancement will maintain the order of the data. However, when this occurs there may be a gap left between the foreground information and the background information which has been modified. In order to close that gap, which is an essential requirement in a text editing system, the freeze-bypass techniques explained with reference to FIGS. 6A – 6C and 7A – 7D can be utilized. That is, the information is advanced to the editing shift register where the gap is closed on a bit by bit basis as explained previously. Additionally, the arrangement for freezing an entire line as shown in FIG. 10D lends itself to resynchronize the data after editing.

EXCHANGE OF WHOLE LINES AND WHOLE PAGES

An exchange of information between two pages in the passive storage or between two lines in the active storage can be done readily without requiring use of the editing shift register (although such can be used). To achieve this the write decoder WD and the read decoder RD are utilized, together with the spare page registers and the spare line registers.

For instance, assume that it is desired to place the contents of page shift register 1 into page shift register 2, and vice versa. To do this, the contents of the page 1 register are connected to the decoder RD and then advanced through the device storage and returned via path 26 and path 30 to the write decoder. This information is then placed into the spare page shift register. After this, the convertible structure allows the random access of the contents of the page 2 shift register which is then moved through the active storage and back to the write decoder. The write decoder then places that information into the page 1 shift register. At this time, the page 2 shift register is empty and the decoders can then be used to remove the information from the spare page shift register and to place it into the page 2 shift register. This completes the process of interchanging the data in the page 1 and page 2 shift registers.

As will be noted for this example of an interchange of page information, the convertible structure provides a powerful tool for quickly accessing information which is to be modified. Rather than having to use the editing shift register, a whole page of data has been interchanged with another page of data in the random access mode, thereby providing quick and efficient data manipulation.

The interchange of complete lines in the active storage could be handled in the same way as the interchange of complete pages. To do this most directly, another decoder should be provided which can be randomly connected to any of the line shift registers and which can be used to remove information from these registers on a selective basis. Since read and write decoders operate on the same principles the read decoder RD can be easily modified to become a write decoder for rearrangement of information in the selective line shift registers.

IV. CONTROL AND INPUT/OUTPUT

This section will discuss various approaches for control and input/output functions. In the described system, all data routing, decoding, and manipulation have been performed by activation of current loops of bubble domain switches and/or bubble domain freezing. To insure proper time sequencing and for activation of the current loops, the control circuits 34 are required. However, bubble domain devices can also be used to minimize the amount of required control circuits and for minimizing the number of connection pins required.

KEYBOARD OPERATIONS

Before discussing preferred control means, various control durations required for performing various functions will be described. These functions are the page, line, character, and user/specified modes of operation.

Page Mode: When a page of data is to be retrieved or stored, all switches (S1 to S6, FIG. 1) are activated for one page. When the passive storage 22 is set into a random access mode, the decoders must also be activated for one page period, plus the decoding time.

Line Mode: To move an active page forward or backward by a line, either the switches at the right-hand side or those at the left-hand side of the active storage 24 must be activated for one line. To delete (or insert) a line of information, the switches S3's (or S5's) at the left-hand side of the background area (or foreground area) must be activated for one line.

Character Mode: The manipulation of characters in the active line requires no switch activation. To advance or backspace the active line by one character, the bypass or freeze loop of a character pointer (to be described later) is activated. For deletion of a character, the character is cleared and the freeze and bypass loops are activated until the end of the line is reached. For insertion of a space immediately following the active character, the freeze and bypass loops are activated until the end of the line, excluding the last character which is assumed to be a space.

User/Specified Mode: In this mode, data are not controlled in a fixed number of cycles. The user of the system specifies what kind of control is required and when such control is to be activated. Such control includes the set or release of tabulation or the line margins.

The necessary keyboard operations are summarized in TABLE 2.

TABLE 2

| | Keyboard Operations | Control Functions |
|---|---|---|
| Ordinary: | | |
| | Character Key depression | character mode |
| | Backspace | character mode |
| | Return carriage | line mode |
| | Tabulation set | user-specified mode |
| | Tabulation release | user-specified mode |
| | Margin set | user-specified mode |
| | Margin release | user-specified mode |
| Additional: | | |
| | Page skip | page mode |
| | Page selection | page mode |
| | Page insertion | page mode |
| | Line advance | line mode |
| | Line backspace | line mode |
| | Line deletion | line mode |
| | Line insertion | line mode |
| | Character deletion | character mode |
| | Character insertion | character mode |

Pointers: All the control modes mentioned previously can be initiated by using bubble domain pointers. A bubble pointer is a shift register which contains information that indicates the position (s) of data in the data shift registers.

Line and page pointers (FIGS. 9A and 9B) When dynamic shift registers, such as magnetic bubble domain registers, are used sequentially, it is not necessary to refer to every individual bit in the shift register. It is sufficient to refer to the relative positions of the beginning bit or some bits in the shift register. Thus, dynamic shift registers can be used as pointers to indicate specific bit positions, and hence to significantly simplify the control circuits which are required.

A pointer is a shift register having the same length as a data shift register and which contains information in the form of bubble domain (s) indicating the position (s) of bit(s) to be controlled. When a bubble domain in the pointer travels to a detector station, it initiates or enables a control function. The positional information contained in the pointer may or may not be changed depending upon the circuitry provided. The pointer is also under the same common drive field H as the data shift registers and can therefore be used in any system using a stoppage or reversal of the drive field.

In word-organized memories, a shift register stores a word of data. The input/output (reading or writing) of any specific shift register is always initiated at the beginning bit position of that register. This can also be done using a pointer. For bit-organized memories the pointer can also be used to indicate the first word or specific words in a block of information.

Figure 9A:
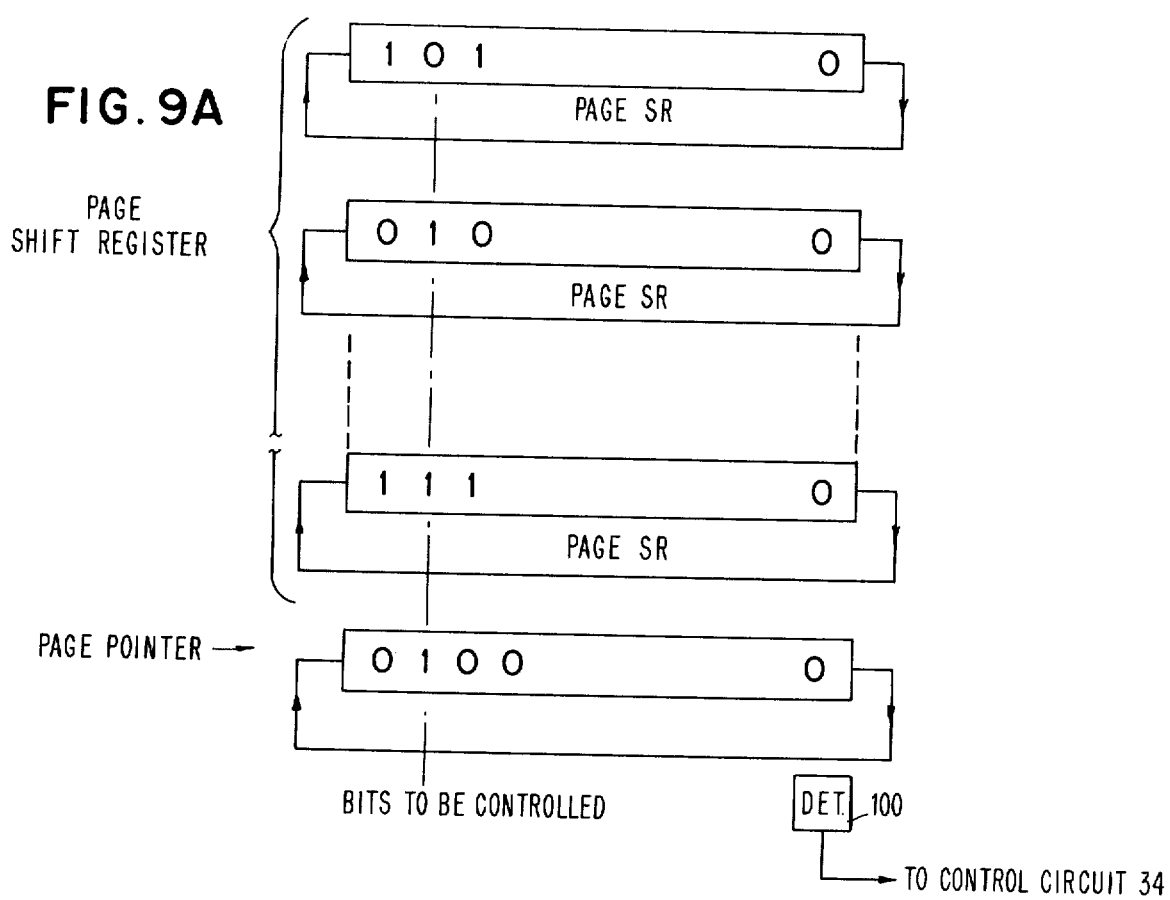
FIGS. 9A and 9B illustrate the use of bubble domain pointers for initiating various control modes used in text editing operations.

FIG. 9A shows a page pointer having a resident bubble domain (1-bit) and the associated page shift registers. The bits in the page shift registers to be controlled by the pointer are indicated and a detector 100 is provided for detection of the resident bubble domain in the pointer. This provides an input which enables the performance of a desired function.

Figure 9B:
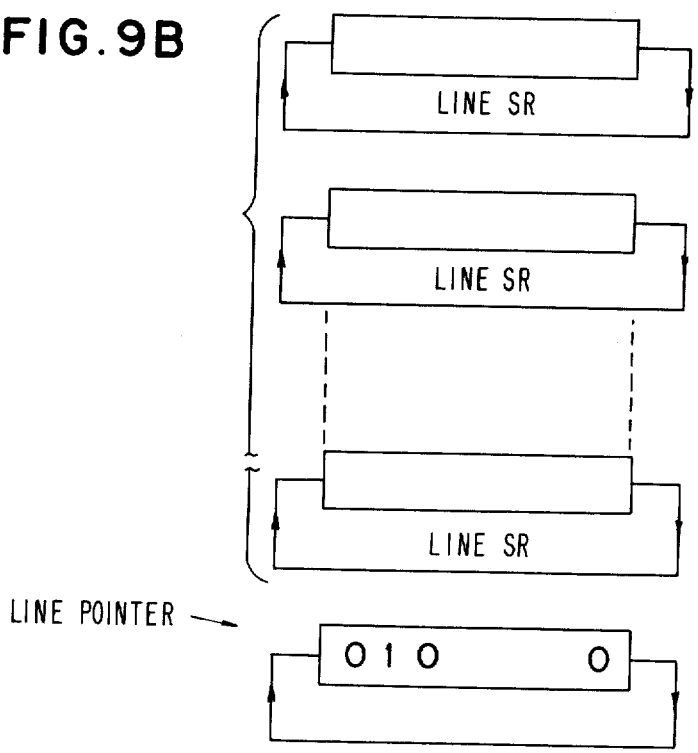

FIG. 9B shows a line pointer associated with a plurality of line shift registers. Operation of this pointer is similar to that of the page pointer shown in FIG. 9A. In both cases, the resident bubble domain in the pointer enables the initiation of the desired control mode when it travels to the position of the detector 100. Since the line pointer and the line data shift registers are of the same length, and since the page shift registers and the page pointer are of the same length, they are synchronized in operation.

Character Pointer: For character mode control a pointer having the same length as a line pointer is used. The resident bubble domain (pointer) in the character pointer enables the control of the corresponding character position, instead of initiating the control for all characters of the shift register. That is, only the character associated with the pointer can be manipulated at a given time. This is termed the active character. A change in the pointer bubble position will change the active character position in the associated shift register.

Figure 10A:
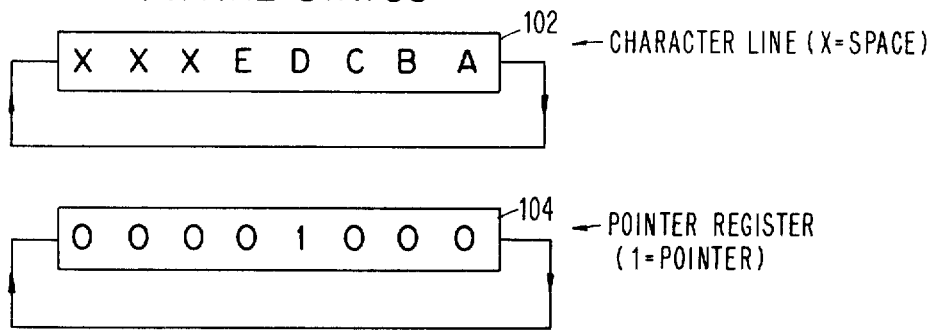
Figure 10B:
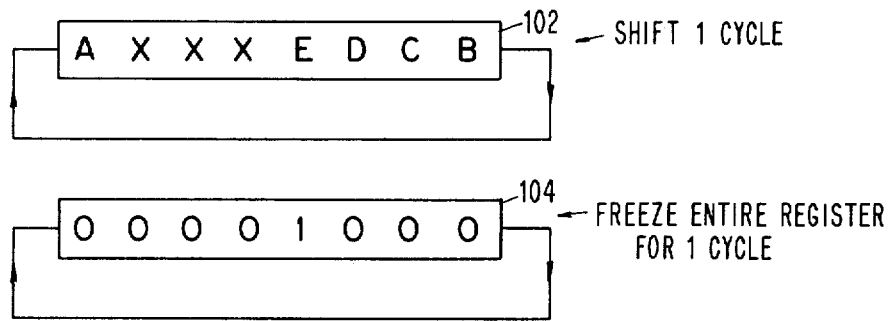
Figure 10C:
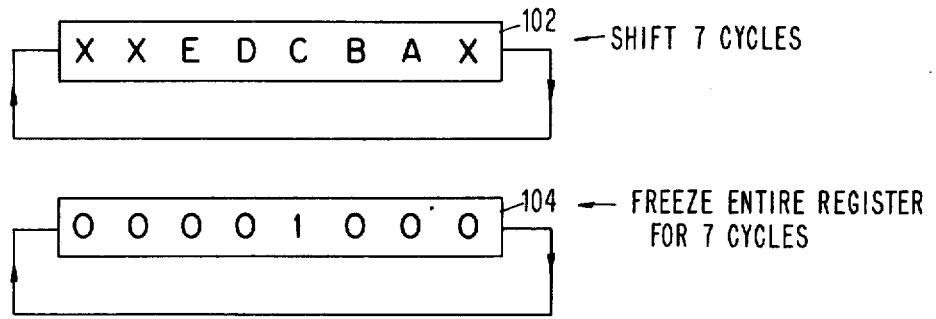
Figure 10D:
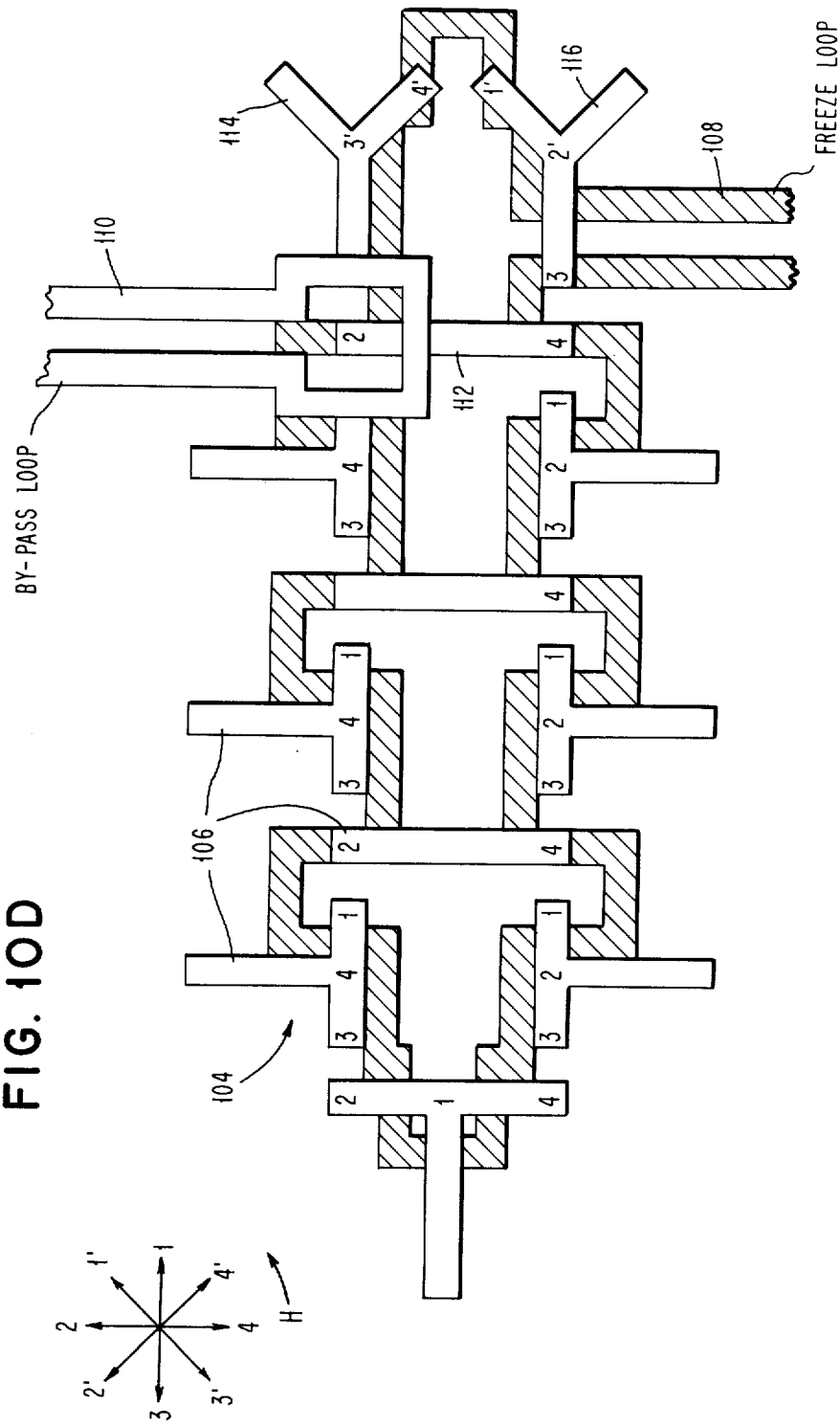
FIG. 10D illustrates an overlay configuration suitable for achieving these operations.

FIGS. 10A – 10C illustrate the operation of the character pointer in more detail, while FIG. 10D shows an implementation of this pointer shift register.

This register is called the pointer register, containing exactly one bubble ("the pointer"). Assuming that only the character associated with the pointer can be manipulated at a given time, the character is designated as the active character.

To change the pointer position will change the active character position. FIG. 10A shows the initial status of both the character line and the pointer. An 8-character line is agin assumed. FIG. 10B shows that when all the bits in the pointer register are frozen for one cycle, the active character position advances one bit position, and becomes E. FIG. 10C shows that when the marker register is frozen for seven cycles, the active character position backspaces by one. In these operations a knowledge of marker position is nowhere assumed.

FIG. 10D shows an overlay circuit for the pointer shift register 104. This register is comprised of permalloy elements 106, a freeze loop comprising conductor 108, and a bypass current loop comprised of conductor 110. The freeze conductor 108 is shown shaded in order to readily identify it. Conductor 108 is a large loop which covers every bit position in register 104. This enables the freezing of all bits in the pointer register when current passes through conductor 10B. Bypass loop 110 need only be localized in the vicinity of one bit position, since it can bypass one bit at a time.

The freeze and bypass operations described previously with respect to the editing shift register are the same as those which occur in the pointer shift register 104. That is, a bubble domain located at bit position 2 on I-bar 112 is held there until the field H rotates to position 4, after which it slides down I-bar 112 to pole position 4. Therefore, any bits wich are in the I/0 positions defined by the Y-bars 114 and 116 are bypassed by the bits which slide down I-bar 112.

User-specified pointer: A pointer can also be used to enable any kind of control function in a user-specified mode. Any number of bubble domains are permitted to be written or cleared at selected positions in the pointer corresponding to those in the data shift register. This type of operation is illustrated with respect to FIGS. 11A – 11C.

In more detail, FIG. 11A illustrates the bit content of a data shift register 118 and of a pointer shift register 120. The pointer register is initially empty.

In FIG. 11B, the pointer has been set such that controls will be enabled for character B and then for character D. This is easily achieved by writing bubble domains into the pointer shift register 120, using a generator in the manner shown with respect to FIG. 8C. Since this is readily apparent to one of skill of the art, a detailed drawing showing the overlay configuration is not provided in FIG. 11B.

FIG. 11C illustrates that the control for character B is reset by clearing the corresponding bubble domain in the pointer.

The number of control loops can be reduced if several pointers can be combined to share a common loop, if they initiate the same operation. For example, pointers for left line margin, right line margin, and tabulation can share a common shift register loop, since all these pointers are used to enable the stoppage of the carriage on the keyboard entry device.

ENCODING (FIGS. 12A – 12C)

To enter characters into the active storage 24, a keyboard can be used to encode legible characters (e.g., alphabets and numerals) into digital codes suitable for data processing. The input of encoded characters can be done by activating current loops of controlled bubble generators. The activation of current loops is enabled by the control signal from the character pointer to insure that only one character is cleared, written, or read during one line.

Figures 12A, 12B:
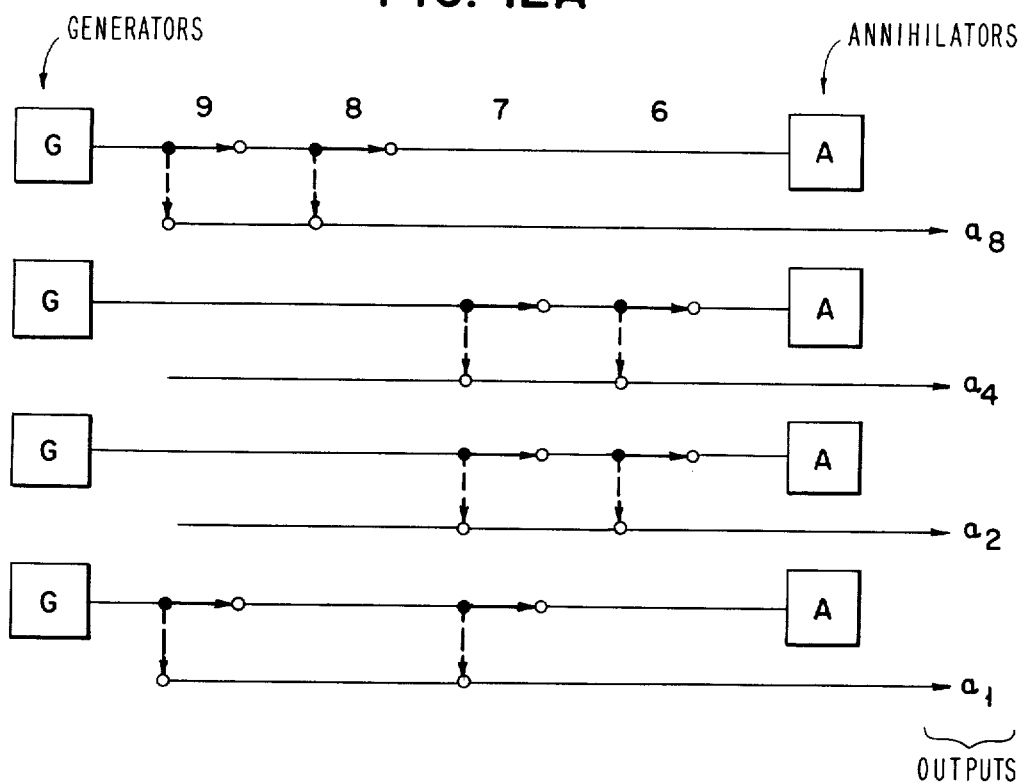
FIG. 12A shows a bubble domain encoder which can be used as a data entry device in the system of FIG. 1, in order to provide an all-bubble domain system.
FIG. 12B symbolically illustrates the operation of a binary coded decimal encoder such as that in FIG. 12A.

This encoding can be implemented by bubble domain devices. For instance, the data entry means 32 of FIG. 1 can be a bubble domain encoder consisting of bubble domain switches. A circuit diagram for a binary coded decimal (BCD) encoder is shown in FIG. 12A. The truth table for the operation of this encoder is shown in FIG. 12B. A detailed implementation of the encoder is shown in FIG. 12C.

In more detail, the encoder is comprised of switches which are organized into columns. Each column represents an alphanumeric character. The presence of a switch in a column corresponds to a 1 in the character code, while the absence of a switch corresponds to a 0 in the character code, as can be seen by referring to FIG. 12B. When none of these switch columns is activated, all bubble domains generated at the left-hand side by the generators G are propagated along the upper paths and annihilated at the right-hand side by the associated annihilator A.

However, when a key on the operator keyboard is depressed, the corresponding column of switches is activated. In this case, bubbles entering the activated switches are switched to the lower paths (which provide the outputs $a_1$, $a_2$, $a_4$, and $a_8$). Bubble domains following these lower paths travel through the encoder output terminals. For example, when the operator depresses the appropriate key for activating switches in columns 8 and 9, a bubble domain from the topmost generator will be sent along its associated lower path and become the output $a_8$. The encoder is used to enter all bits pertaining to a character simultaneously into their respective chips.

FIG. 12C shows a permalloy (or any magnetically soft material) implementation for an encoder. This circuit is comprised of permalloy patterns for moving the bubble domains under the influence of a rotating inplane magnetic field H and a plurality of conductor loops which comprise the switch columns 9, 8, 7, and 6. Each permalloy pattern is comprised of an upper path 122U and a lower path 122L. Depending on the activation of the switch columns, bubble domains from the generators G pass along the upper paths to the associated annihilators or are switched to the associated lower paths and become the outputs $a_1$, $a_2$, $a_4$, and $a_8$.

Conductor loops 124, 126, 128, and 130 are provided for the switch columns 9, 8, 7, and 6 respectively. Currents through these conductors create magnetic fields which hold bubble domains in certain positions so as to have them travel a different path when the field H continues its rotation.

For example, a bubble domain from the topmost generator travels to the topmost annihilator along the propagation pattern 122U. When it is in pole position 2 of T-bar 132, the presence of a current in conductor 24 will hold that domain at that pole position. As field H rotates to direction 4, the domain held at pole position 2 of T-bar 132 will slide down to pole position 4 of this T-bar. It will then proceed to the right following propagation pattern 122L, and will become an output $a_R$.

In the operation of the encoder, it was assumed that bubble domains travel along the upper paths 122U without voids. This assumption can be fulfilled if the interval between successive depressions of the keyboard keys is equal to or larger then the total delay time along the paths 122. Alternatively, the assumption can be realized which when bubble domain compressor circuits are used to replace the propagation patterns 122.

V. HARDWARE CONSIDERATIONS

Magnetic bubble memories consist of dynamic shift registers which offer various structural and operational flexibilities for functions such as text editing. In the design of the device described herein, attempts have been made to achieve a simple overall system. This was accomplished by observing the following requirements:

1. The rotating field H is never reversed. This simplifies the peripheral electronics (control circuits 34) and also permits the use of tank circuit drive when large rotating field energy is needed for large storage capacity.

2. The devices shown for editing and sorting data and the devices for storing information are compatible in design and are hosted in the same storage medium in order to realize integrated circuit chips.

3. Many bubble domain switches are required in the address decoders, bubble routing and timing circuits, and for implementing other local control functions for the text editing system. These switches can be implemented by current loops. The use of these current activated switches, rather than field activated switches which are known in the art, permits the simultaneous operation of many functions executed by field rotation while the switching function executed by the current loops is underway. However, it will be appreciated by those of skill in the art that field activated switches can also be designed for use in a text editing system.

4. The text editing machine described is a highly interactive system. This system should be designed so that frequently used operations, such as advancing a line, are made faster than the user's reaction time. Less frequently used operations, such as the retrieval of a page, may tolerate longer delays and require less stringent circuit design.

CONNECTION PIN REQUIREMENTS

When it is assumed that the system adopts an 8-bit character set and stores 32 pages of characters in the passive storage, then 8 64K-bit chips plus one control chip are required. A 1KHz in-plane magnetic field H which gives a 2.4 second page transfer time is adequate for this system. In this regard, it should be noted that currently available bubble domain devices are capable of 100KHz data rates so that the system is easily implemented with present technology.

The number of external connections required for the control function is as follows:

| | |
|---|---|
| Write (one per chip) | 8 |
| Read (one per chip) | 8 |
| Clear | 1 |
| Switch for sequential/random selection (passive storage) | 2 |
| Switch for line manipulations (active storage) | 4 |
| Decoder (32 pages) | 10 |
| Page pointer | 1 |
| Line pointer | 1 |
| Character pointer | 1 |
| Stop carriage pointer | 1 |
| Ground | 1 |
| TOTAL | 38 |

If an on-chip decoder of the type previously described is used, than each chip must have (64 + 1) connections for the 64-symbol character set plus 1 connection for the shift-key. These encoder connections are also shared by all eight chips. Thus the total number of connections becomes 38 − 16 + 65 = 87.

SUMMARY

What has been described is a text editing system which employs magnetic bubble domain shift registers and current controlled bubble domain switches. However, those having skill in the art will be able to design other components which achieve the functions taught herein. The system offers flexible storage structures to facilitate the input, output, retrieval, and revision of data. In addition, the system provides a wide range of data manipulation functions and facilitates the timing controls and character encoding.

The system which was described is an example of the use of bubble technology for applications with a mix of large-portion data storage and small-portion data processing. Process control, file sorting, and file management in disk or tape-like storages are other examples.

The insertion of new records into or the removal of old records from a sequential file in a static storage (such as a magnetic tape) always requires the copying of the entire file. By using the modified active storage structure shown in FIG. 8A – 8C to form a sequential file, records (corresponding to lines in FIGS. 8A – 8C) can be deleted or inserted without requiring that copying. Furthermore, this structure can also be used in more complex editing systems in which format codes are used to determine paragraphs, sentences, words, margin justification, and centering.

The device and system configurations described herein can be implemented by MOS dynamic shift registers as well as by magnetic bubble domain shift registers. The conversion switches are also useful for dynamic ordering of data. As compared to other techniques for dynamic ordering such as are shown in U.S. Pat. No. 3,670,313, U.S. Pat. No. 3,701,132, and U.S. Pat. No. 3,797,002, which require the reversal or stoppage of the rotating field H, the present technique is much simpler in hardware.

The bit ordered storage shown herein is adaptable to many different character sets. With the availability of inexpensive large-capacity memory chips, this text editing system may be very useful for character sets with large numbers of symbols, such as are employed in the Chinese language. In this regard the principle as taught in rewritable decoder of Ser. No. 429,411, filed Dec. 28, 1973, may be advantageously employed to realize a universal rewritable encoder.

What is claimed is:
1. An apparatus for data manipulation, comprising:
a plurality of dynamic shift registers in which said data can be stored,
switch means for controllably connecting said shift registers in series for sequential access of data in said shift registers, said series connected registers having no bit position through which said data passes twice as it moves entirely through said series connection of registers, and
switch means for controllably disconnecting said shift registers from one another and for making said shift registers closed loop shift registers having no common bit positions.

2. The apparatus of claim 1, where said data in said shift registers are moved by a repetitive sequence of drive pulses which are constant in sequence.

3. The apparatus of claim 1, where said switch means are connected to each shift register, said switch means including means for changing the state of said switches.

4. The apparatus of claim 1, where said dynamic shift registers are comprised of bubble domain devices.

5. The apparatus of claim 4, where said switches are comprised of current carrying conductors.

6. The apparatus of claim 1, where said dynamic shift registers are comprised of charge coupled devices.

7. A data manipulation apparatus, comprising:
a plurality of dynamic shift registers for storage of data therein,
means for placing said data in selected shift registers,
means for randomly accessing data from any selected shift register,
means for sequentially accessing data from said shift registers,
editing means for editing data from any said shift register,
said editing means being comprised of a shift register having phase means associated therewith for changing the order of said data in said editing shift register, and
means for producing a fixed sequence of drive pulses for moving said data and for freezing said data and changing the order of said data.

8. The apparatus of claim 7, where said data are comprised of magnetic bubble domains.

9. The apparatus of claim 7, where said data are comprised of electrical charges.

10. The apparatus of claim 7, where said means for placing is a decoder, and said means for randomly accessing is a decoder.

11. The apparatus of claim 7, further including means for disconnecting said shift registers, and means for connecting said shift registers in series.

12. An apparatus for manipulation of magnetic bubble domains in a magnetic medium, comprising:
a plurality of shift registers in which said data can be stored,
means for randomly accessing said bubble domains in selected ones of said shift registers and for moving said bubble domains to an editing shift register,
an editing shift register in which manipulation of the data in said selected register occurs, said editing shift register including
freeze means for holding selected ones of said bubble domains in fixed positions in said magnetic medium, and,
bypass means for routing other bubble domains around said domains held by said freeze means,
magnetic field means for producing a rotating magnetic field in the plane of said magnetic medium, said shift registers and said editing shift register being operative simultaneously in response to a fixed direction of rotation of said magnetic field, and
conversion switches for connecting said shift registers in series for sequentially accessing the contents of said shift registers and for disconnecting said shift registers from one another.

13. An apparatus for manipulation of magnetic bubble domains in a magnetic medium, comprising:
a plurality of shift registers in which said data can be stored,
means for randomly accessing said bubble domains in selected ones of said shift registers and for moving said bubble domains to an editing shift register,
an editing shift register in which manipulation of the data in said selected register occurs, said editing shift register including
freeze means for holding selected ones of said bubble domains in fixed positions in said magnetic medium, and,
bypass means for routing other bubble domains around said domains held by said freeze means,
magnetic field means for producing a rotating magnetic field in the plane of said magnetic medium, said shift registers and said editing shift register being operative simultaneously in response to a fixed direction of rotation of said magnetic field, and
additional shift registers for receiving the contents of said first-mentioned shift registers, said additional shift registers having switch means associated therewith for sequentially connecting some of said additional shift registers and for disconnecting others of said additional shift registers.

14. The apparatus of claim 13, including control circuits for controlling the operation of said first-mentioned shift registers, said additional shift registers, and said editing shift register.

15. A text editing system, comprising:
a passive storage comprised of a plurality of first shift registers in which data representing said text can be stored,
means for placing said data into selected ones of said first shift registers,
access means for accessing the data in any selected one of said first shift registers,
an active storage comprised of a plurality of second shift registers for receiving data accessed from one of said first shift registers,
an editing shift register which can be connected to said second shift registers for manipulation of data in said second shift registers,
a host medium in which said data is represented by entities movable in said host medium, wherein the same host medium is shared by said first shift registers, said second shift registers, and said editing shift register.

16. The system of claim 15, in which said host medium is a magnetic medium and said data is comprised of patterns of magnetic bubble domains.

17. The system of claim 15, in which said host medium is a semiconductor medium and said data is comprised of electrical charges.

18. The system of claim 15, in which the data bits in said first shift register, in said second shift registers, in said editing shift register, and in said means for placing data and said means for selectively accessing data all share the same magnetic medium.

19. The system of claim 15, where said editing shift register includes freeze means for holding data bits in said editing shift register in fixed position therein, and bypass means for causing other data bits in said shift register to move past said bits which are held by said freeze means.

20. The system of claim 19, further including means for producing drive pulses which occur in a fixed sequence for moving data in said first shift registers, in said second shift registers, and in said editing shift register.

21. The system of claim 20, where said means for producing said drive pulses is a field means for producing a magnetic field which rotates in a single direction, and said data bits are magnetic bubble domains.

22. The system of claim 15, further including conversion means for connecting said first shift registers in series for sequential access of data contained therein, and for converting said first shift registers into isolated closed loop shift registers.

23. The system of claim 22, where said data bits are bubble domains, and said conversion means are comprised of current controlled switches.

24. The system of claim 15, further including conversion means for connecting some of said second registers in series so that data enhances sequentially in said connected registers, and for disconnecting others of said second registers to create closed loop shift registers which are isolated from one another.

25. The system of claim 24, further including write means for inserting new information into said active storage and read means for reading information in said active storage.

26. The system of claim 24, further including means for changing the information in said second shift registers which are connected sequentially and further means for changing the data in the second shift registers which are isolated from one another.

* * * * *